United States Patent
Leiba et al.

(10) Patent No.: US 8,784,123 B1
(45) Date of Patent: Jul. 22, 2014

(54) ELECTRICAL CONNECTOR

(71) Applicant: Google Inc., Mountain View, CA (US)

(72) Inventors: Aaron Leiba, San Francisco, CA (US); Adam Rodriguez, San Francisco, CA (US); Zhonghua Wu, Freemont, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/101,316

(22) Filed: Dec. 9, 2013

(51) Int. Cl.
  *H01R 27/00* (2006.01)
(52) U.S. Cl.
  USPC .......................................................... 439/218
(58) Field of Classification Search
  USPC .......................................................... 439/218
  See application file for complete search history.

(56) References Cited

U.S. PATENT DOCUMENTS

| | | | |
|---|---|---|---|
| 4,077,690 | A | 3/1978 | Koether |
| 4,993,975 | A | 2/1991 | Asick et al. |
| 5,278,725 | A | 1/1994 | Konno et al. |
| 5,751,544 | A | 5/1998 | Song |
| 5,771,540 | A | 6/1998 | Carpenter et al. |
| 5,941,729 | A | 8/1999 | Sri-Jayantha |
| 6,431,887 | B1 | 8/2002 | Yeomans et al. |
| 6,461,192 | B1 | 10/2002 | Kwoka |
| 6,481,057 | B2 | 11/2002 | Lin |
| 7,021,969 | B2 | 4/2006 | Matsunaga |
| 7,052,326 | B2 | 5/2006 | Yu |
| 7,055,215 | B1 | 6/2006 | Ligtenberg et al. |
| 7,322,838 | B1 | 1/2008 | Chen et al. |
| 7,351,109 | B2 | 4/2008 | Wang |
| 7,645,143 | B2 | 1/2010 | Rohrbach et al. |
| 7,682,158 | B2 | 3/2010 | Tsai |
| 7,845,985 | B2 | 12/2010 | Brunker et al. |
| 7,984,532 | B2 | 7/2011 | Huang |
| 8,057,263 | B1 | 11/2011 | Howard et al. |
| 8,091,178 | B2 | 1/2012 | Degner et al. |
| 8,152,569 | B2 | 4/2012 | Chen et al. |
| 8,323,057 | B2 | 12/2012 | Ho |
| 8,348,704 | B2 | 1/2013 | Sloey et al. |

(Continued)

FOREIGN PATENT DOCUMENTS

| | | |
|---|---|---|
| EP | 1670101 A1 | 6/2006 |
| EP | 1933259 A1 | 6/2008 |
| WO | 2011/150403 A1 | 12/2011 |

OTHER PUBLICATIONS

Apple Connector, May 15, 2013, 1 page.

(Continued)

*Primary Examiner* — Ross Gushi
(74) *Attorney, Agent, or Firm* — Brake Hughes Bellermann LLP

(57) ABSTRACT

An electrical connector may include a cord comprising wires and a plug extending from the cord. The plug may include a first top row of contacts included in a top portion of the plug and a first bottom row of contacts included in a bottom portion of the plug. The first top row of contacts may be coupled to the plurality of wires and include a first top differential signaling pair configured to carry signals according to a first communication protocol, and a second top differential signaling pair configured to carry signals according to a second communication protocol. The first bottom row of contacts may be coupled to the first top row of contacts and arranged to maintain a same arrangement of contacts and electrical paths as the first top row of contacts to the plurality of wires when the plug is rotated one hundred and eighty degrees.

28 Claims, 24 Drawing Sheets

(56) References Cited

U.S. PATENT DOCUMENTS

| | | | |
|---|---|---|---|
| 8,506,332 B2 | 8/2013 | Sommers et al. | |
| 8,517,751 B1* | 8/2013 | Golko et al. | 439/218 |
| 8,517,766 B2* | 8/2013 | Golko et al. | 439/607.41 |
| 8,535,075 B1* | 9/2013 | Golko et al. | 439/218 |
| 8,573,995 B2* | 11/2013 | Golko et al. | 439/218 |
| 8,597,056 B2 | 12/2013 | Blanchfield et al. | |
| 8,684,769 B2 | 4/2014 | Kao et al. | |
| 2006/0024997 A1 | 2/2006 | Teicher | |
| 2006/0065681 A1 | 3/2006 | Yeh et al. | |
| 2007/0186382 A1 | 8/2007 | Huang | |
| 2012/0015561 A1 | 1/2012 | Tsai | |
| 2013/0095701 A1* | 4/2013 | Golko et al. | 439/660 |
| 2013/0095702 A1* | 4/2013 | Golko et al. | 439/676 |
| 2013/0115817 A1* | 5/2013 | Terlizzi et al. | 439/620.21 |
| 2013/0115821 A1* | 5/2013 | Golko et al. | 439/638 |
| 2013/0122754 A1* | 5/2013 | Golko et al. | 439/676 |
| 2013/0149911 A1* | 6/2013 | Golko et al. | 439/668 |
| 2013/0210261 A1* | 8/2013 | Weber et al. | 439/358 |
| 2013/0217253 A1* | 8/2013 | Golko et al. | 439/345 |
| 2013/0244472 A1* | 9/2013 | Weber et al. | 439/370 |
| 2013/0244489 A1* | 9/2013 | Terlizzi et al. | 439/620.01 |
| 2013/0244491 A1* | 9/2013 | Sarwar et al. | 439/655 |
| 2013/0244492 A1* | 9/2013 | Golko et al. | 439/660 |

OTHER PUBLICATIONS

Apple Lightning, May 15, 2013, 1 page.

Apple Mag-Safe Adapter, Apr. 12, 2013, 1 page.

Micro USB Plug, May 15, 2013, 1 page.

"Apple is Granted 6 MacBook Pro Design Patents in Hong Kong", Patently Apple, retrieved on Apr. 16, 2013 from www.patentlapple.com/patently-apple/2013/04/apple-is-granted-6-macbook-pro-design-patents-in-hong-kong.htm, 9 pages.

"DisplayPort", from Wikipedia, the free encyclopedia, Sep. 4, 2013, 13 pages.

"HDMI", from Wikipedia, the free encyclopedia, Sep. 4, 2013, 30 pages.

"MacBook Pro (Retina, 15-inch, Early 2013)—Technical Specifications", Mar. 19, 2013, 4 pages.

Schock, "How to Fix a Wobbly Macbook Pro Screen", retrieved from schock.net/articles/2012/02/20/how-to-fix-a-wobbly-macbook-pro-screen/, Feb. 20, 2012, 4 pages.

"Bare PCB Test Probes", Datasheet, Feb. 16, 2012, 1 page.

"USB Connectors", C2G, retrieved from http://www.cablestogo.com/support/connector-guides/usb, 2 pages.

"Mini USB C Type Connector", Specification, Mouser Electronics, Jun. 21, 2012, 1 page.

Restriction Requirement Response for U.S. Appl. No. 14/101,321, filed Apr. 9, 2014, 1 page.

International Search Report and Written Opinion for International Application No. PCT/US2014/010050, mailed Mar. 28, 2014, 15 pages.

* cited by examiner

ELECTRICAL CONNECTOR

TECHNICAL FIELD

This description relates to electrical connectors for transmitting electrical signals and/or power between electronic devices.

BACKGROUND

Electrical connectors may transmit signals and/or power between electronic devices, such as computing devices. The electronic devices such as computing devices may include receptacles that receive the electrical connectors. The computing devices may include portable computing devices such as laptop or notebook computers, tablets, or netbooks, may include smartphones, or may include desktop computers.

SUMMARY

According to an example embodiment, an electrical connector may include a cord comprising a plurality of wires, and a plug extending from the cord. The plug may include a first top row of contacts included in a top portion of the plug and a first bottom row of contacts included in a bottom portion of the plug. The first top row of contacts may be coupled to the plurality of wires and include a first top differential signaling pair configured to carry signals according to a first communication protocol, and a second top differential signaling pair configured to carry signals according to a second communication protocol. The first top differential signaling pair may be closer to a center of the first top row of contacts than the second top differential pair. The first communication protocol may have a higher data rate than the second communication protocol. The first bottom row of contacts may be coupled to the first top row of contacts and arranged to maintain a same arrangement of contacts and electrical paths as the first top row of contacts to the plurality of wires when the plug is rotated one hundred and eighty degrees.

According to another example embodiment, an electrical connector may include a cord comprising a plurality of wires and a plug extending from the cord. The plug may include a top portion, a first side portion adjacent to the top portion, a bottom portion adjacent to the first side portion and opposing the top portion, and a second side portion adjacent to the top portion and to the bottom portion, the second side portion opposing the first side portion. The top portion may include at least a first top row of contacts and a second top row of contacts, the first top row of contacts including a first top contact that is closer to a center of the first top row of contacts than remaining contacts in the first top row of contacts, the second top row of contacts including a second top contact that is closer to a center of the second top row of contacts than remaining contacts in the second top row of contacts. The bottom portion may include at least a first bottom row of contacts and a second bottom row of contacts, the first bottom row of contacts including a first bottom contact that is closer to a center of the first bottom row of contacts than remaining contacts in the first bottom row of contacts, the first bottom contact being coupled to the first top contact, the second bottom row of contacts including a second bottom contact that is closer to a center of the second bottom row of contacts than remaining contacts in the second bottom row of contacts, the second bottom contact being coupled to the second top contact.

According to another example embodiment, an electrical connector may include a cord comprising a plurality of wires, and a plug extending from the cord. The cord may include electrical contacts on a top portion and a bottom portion of the plug so that when the plug is rotated one hundred and eighty degrees an arrangement and coupling of the electrical contacts remains the same. The electrical contacts may include a top row of electrical contacts on the top portion of the plug, the top row of electrical contacts comprising a first top differential pair configured to transmit signals according to a first communication protocol and a second top differential pair configured to transmit signals according to a second communication protocol, the first top differential pair being closer to a center of the top row of electrical contacts than the second top differential pair, the first communication protocol having a higher data rate than the second communication protocol.

According to another example embodiment, an electrical receptacle may include a first row of electrical contacts extending along a side of the receptacle a first distance from an opening of the electrical receptacle and a second row of electrical contacts extending along the side of the receptacle a second distance from the opening of the electrical receptacle. The first row of electrical contacts may include a first receptacle differential signaling pair configured to carry signals according to a first communication protocol, the first receptacle differential signaling pair including a first receptacle contact and a second receptacle contact, the first receptacle contact and the second receptacle contact being closer to a center of the first row of electrical contacts than remaining contacts in the first row of electrical contacts, and a second receptacle differential signaling pair configured to carry signals according to a second communication protocol, the second communication protocol having a lower data rate than a data rate of the first communication protocol, the second receptacle differential signaling pair including a third receptacle contact and a fourth receptacle contact. The second row of electrical contacts may include a third receptacle differential signaling pair configured to carry signals according to the first communication protocol, the third receptacle differential signaling pair including a fifth receptacle contact and a sixth receptacle contact, the fifth receptacle contact and the sixth receptacle contact being closer to a center of the second row of electrical contacts than remaining contacts in the second row of electrical contacts.

According to another example embodiment, a computing device may include at least one processor configured to execute instructions, at least one memory device configured to store instructions executable by the at least one processor, a receptacle electrically coupled with the at least processor, the receptacle defining an opening symmetrically bisected by a plane orthogonal to the opening, a first pair of signaling contacts intersected by the plane and configured to transmit and/or receive data based on a first communication protocol, and a second pair of signaling contacts disposed entirely on one side of the plane and configured to transmit and/or receive data based on a second communication protocol having a lower data rate than a data rate of the first communication protocol.

According to another example embodiment, a computing device may include at least one processor configured to execute instructions, at least one memory device configured to store instructions executable by the at least one processor, and a receptacle comprising multiple electrical contacts configured to communicate with the at least processor. The multiple electrical contacts may include at least a first differential signaling pair for transmitting and/or receiving data according to a first communication protocol and a second differential signaling pair for transmitting and/or receiving data according to a second communication protocol. The second communication protocol may have a lower data rate than the first communication protocol. The first differential signaling pair may include a first electrical contact and a second electrical contact, the first electrical contact and the second electrical contact being a first distance from an opening of the receptacle. The second differential signaling pair may include a third electrical contact and a fourth electrical contact, the third electrical contact and the fourth electrical contact being the first distance from the opening of the receptacle. The second differential signaling pair may have a lower data rate than the first differential signaling pair. The third electrical contact may be farther than the first electrical contact and the second electrical contact from an imaginary line through a center of the at least one side of the receptacle. The imaginary line may be perpendicular to the opening of the receptacle. The fourth electrical contact may be farther than the first electrical contact and the second electrical contact from the imaginary line.

According to another example embodiment, a communication system may include a plug and a receptacle. The plug may include a first row of electrical contacts and a second row of electrical contacts. The first row of electrical contacts may be disposed between a front of the plug and the second row of electrical contacts. The first row of electrical contacts may include a first pair of differential signaling contacts configured to transmit and/or receive data based on a first communication protocol, and a second pair of differential signaling contacts configured to transmit and/or receive data based on a second communication protocol. The second communication protocol may have a lower data rate than a data rate of the first pair of differential signaling. The second row of electrical contacts may include a third pair of differential signaling contacts. The receptacle may receive the plug and include a single row of contacts including a plurality of contacts corresponding with the second pair of differential signaling contacts. The receptacle may exclude any electrical contacts corresponding with the second row of electrical contacts.

The details of one or more implementations are set forth in the accompanying drawings and the description below. Other features will be apparent from the description and drawings, and from the claims.

DETAILED DESCRIPTION

Figure 1A:
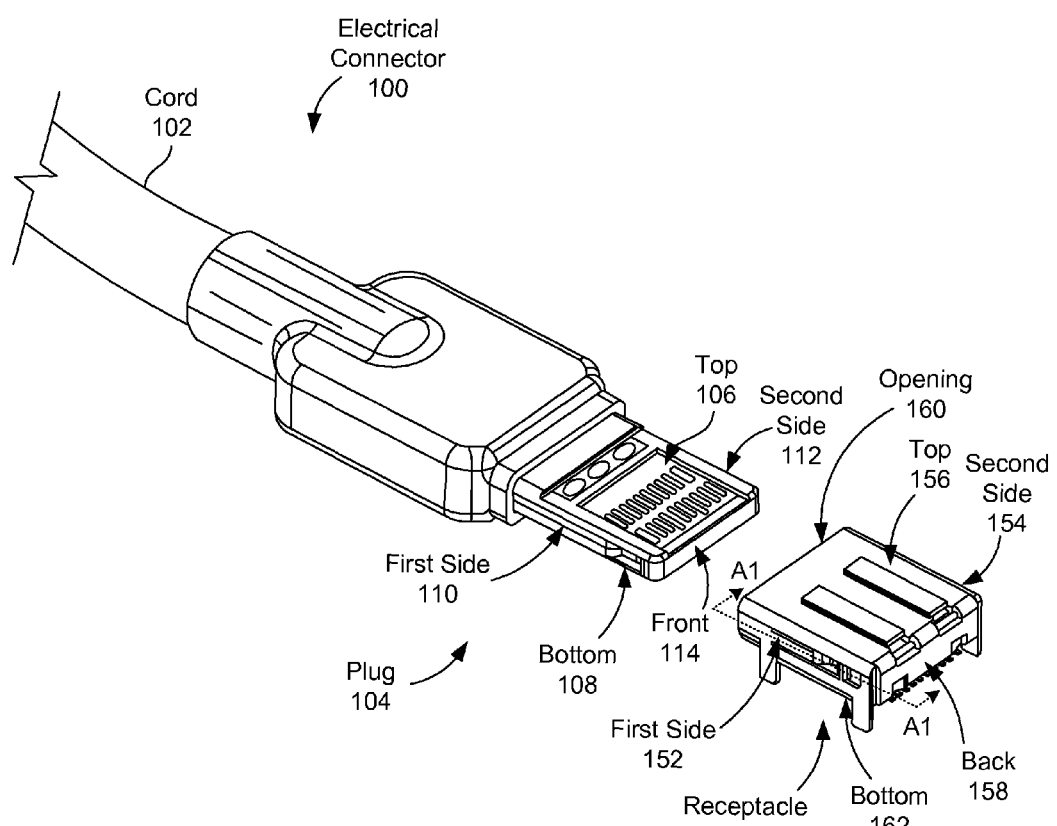
FIG. 1A is a perspective view of an electrical connector and a receptacle according to an example embodiment.

FIG. 1A is a perspective view of an electrical connector 100 and a receptacle 150 for receiving the electrical connector 100 according to an example embodiment. The electrical connector 100 may include a cord 102 and a plug 104. The cord 102 may include a plurality of wires. The plurality of wires may be coupled to contacts (not labeled in FIG. 1A) in the plug 104. The plug 104 may include the contacts coupled to the wires within the cord 102.

The plug 104 may be shaped as a parallelepiped, such as a rectangular prism, with contacts, ridges, and/or depressions on the exterior sides, according to an example embodiment. The plug 104 may include a top portion 106, a first side portion 110 adjacent to the top portion, a bottom portion 108 adjacent to the first side portion 110 and opposing the top portion 106, and a second side portion 112 adjacent to the top portion 106 and bottom portion 108 and opposing the side portion 110. The plug 104 may also include a front portion 114 adjacent to the top portion 106, the first side portion 110, the bottom portion 108 and the second side portion 112. The plug 104 may include a printed circuit board (PCB) with multiple layers.

The plug 104 may be inserted into a receptacle, such as the receptacle 150 shown in FIG. 1A. An interior of receptacle 150 may also be shaped as a parallelepiped, such as a rectangular prism with contacts on one or more of the interior sides, and may include an opening 160 with a cavity (not shown in FIG. 1A) that receives the plug 104. The receptacle 150 may include a top 156, a first side 152 adjacent to the top 156, a bottom 162 adjacent to the first side 152 and opposing the top 156, and a second side 154 adjacent to the top 156 and bottom and opposing the first side 152. The receptacle 150 may also include a back 158. The back 158 may provide a limit or backstop preventing the plug 104 from being inserted into the receptacle 150 beyond a predetermined distance. The plug 104 may be inserted into the receptacle 150 until the front 114 of the plug 104 contacts an interior side of the back 158 of the receptacle.

Figure 1B:
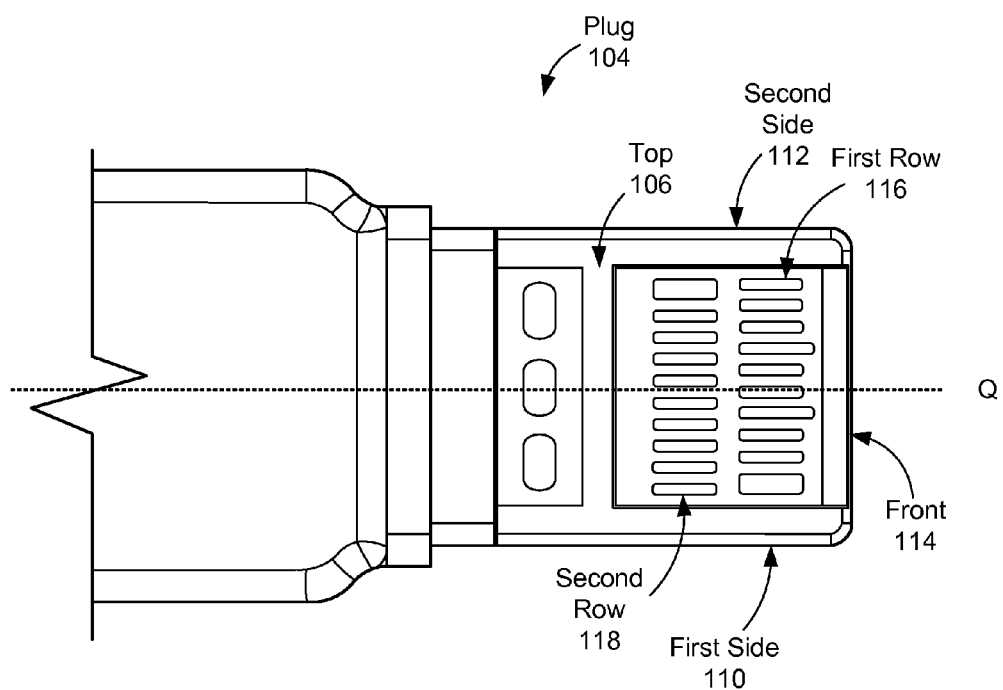
FIG. 1B is a top view of a plug included in the electrical connector shown in FIG. 1A according to an example embodiment.

FIG. 1B is a top view of the plug 104 included in the electrical connector 100 shown in FIG. 1A according to an example embodiment. In the example shown in FIG. 1B, the plug 104 may include a first top row 116 of contacts and a second top row 118 of contacts. The first top row 116 and the second top row 118 may both extend across the top 106 of the plug 104. The first top row 116 and the second top row 118 may extend across the top 106 of the plug 104 from the first side 110 to the second side 112 (and/or from the second side 112 to the first side 110), in a direction perpendicular to the direction in which the plug 104 extends from the cord 102 (not shown in FIG. 1B). The plug 104 may also include a first bottom row of contacts (not shown in FIG. 1B) and a second bottom row of contacts (not shown in FIG. 1B) which extend across the bottom 108 of the plug 104 from the first side 110 to the second side 112 (and/or from the second side 112 to the first side 110), in the direction perpendicular to the direction in which the plug 104 extends from the cord 102.

The contacts in the first top row 116 and second top row 118 may be coupled to the wires included in the cord 102. The contacts may be made of an electrically conductive material including metal such as aluminum, copper, silver, or gold. In an example embodiment, one of the contacts, in either the first top row 116 or the second top row 118 on the top 106 of the plug 104, may be coupled to each of the wires in the cord 102, and one of the contacts in either the first bottom row or the second bottom row on the bottom 108 of the plug 104 may be coupled to each of the wires in the cord 102. As shown and described further with respect to FIG. 1C, the receptacle 150 may include two rows of contacts on one side (the top or bottom) which may coupled to either the first top row 116 and second top row 118 or the first bottom row and the second bottom row of the plug 104, depending on the orientation of the plug 104, coupling each contact in the receptacle 150 to one of the wires in the cord 102.

While the first top row 116 includes ten contacts and the second top row 118 includes ten contacts in the example shown in FIG. 1B, the first top row 116 and the second top row 118, as well as the first bottom row and the second bottom row, may include any number of contacts according to various example embodiments. The first bottom row may include a same number of contacts as the first top row 116, mirroring the first top row to maintain polarity after a one hundred and eighty degree (180°) rotation of the plug 104 about axis Q (which is an axis along which the plug 104 is aligned), and may be a same distance from the front 114 as the first top row 116. The second bottom row may also include a same number of contacts as the second top row 116, mirroring the second top row to maintain polarity after a one hundred and eighty degree rotation of the plug 104 about axis Q, and may be a same distance from the front 114 as the second top row 116. The mirroring may cause contacts on the bottom 108 of the plug 104 to appear in a similar position and/or arrangement as the contacts on the top 106 of the plug 104 after the one hundred and eighty degree rotation, maintaining functionality of the plug 104. Contacts on the bottom of the plug 104 with a given distance from the first side 110 may be coupled to, contact, and/or engage contacts on the top of the plug 104 which have the same distance from the second side 112, and contacts on the bottom of the plug 104 which have a given distance from the second side 112 may be coupled to contacts on the top 106 of the plug 104 which have the same distance from the first side 110, maintaining functionality of the plug 104 after the one hundred and eighty degree rotation. As used herein between contacts on different devices (one contact on a plug and the other on a receptacle), "coupling" may also include "contacting" and/or "engaging."

Figure 1C:
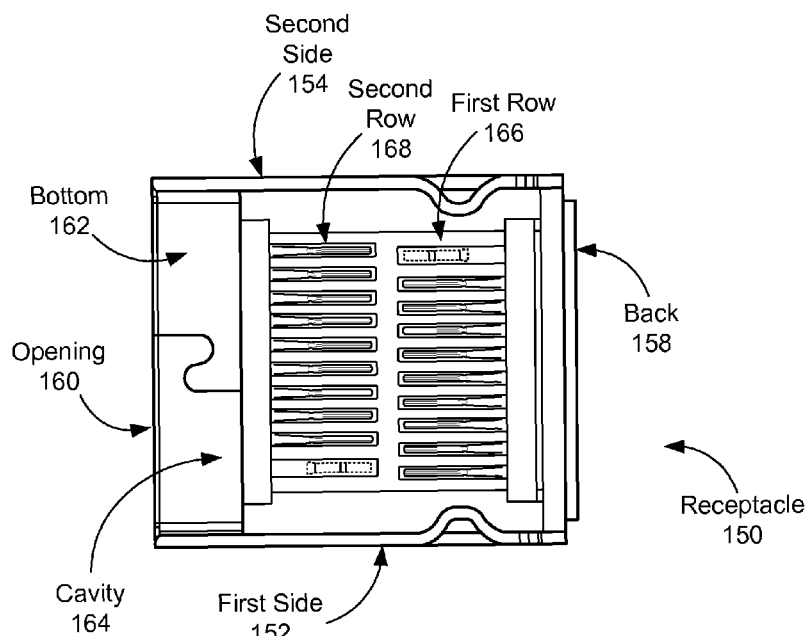
FIG. 1C is a top cross-sectional view of the receptacle shown in FIG. 1A according to an example embodiment.

FIG. 1C is a top cross-sectional view of the receptacle 150 shown in FIG. 1A according to an example embodiment. The top cross-sectional view is cut along line A1 in the receptacle 150 in FIG. 1A. In FIG. 1C, an interior surface or side (not labeled) of the bottom 162 of the receptacle is shown. The bottom 162 of the receptacle 150 includes a first row 166 and second row 168 of contacts. The contacts may face toward a cavity 164 of the receptacle 150. In other words, the contacts are facing in direction out of the page toward the cavity 164 of the receptacle 150.

FIG. 1C shows the first row 166 and the second row 168 as being on the interior side of the bottom 162 of the receptacle 150, facing the top 156 (not shown in FIG. 1C) of the receptacle. Although not shown, additional first and second rows may also be included in the interior of the top 156 of the receptacle 150, facing toward the bottom 162, or on another side of the receptacle facing toward the interior and/or cavity 164.

The first row 166 and second row 168 of the receptacle 150 may correspond to the first top row 116 and second top row 118 and/or to the first bottom row (not shown) and the second bottom row (not shown) of the plug 104 shown in FIG. 1B, with similar distances and/or spacings between the contacts and similar distances between the contacts in the receptacle and an interior of the back 158 of the receptacle as the distances between the contacts on the plug 104 and the front 114 of the plug 104. When the plug 104 is inserted into the receptacle 150, the contacts in the first and second rows 166, 168 of the receptacle 150 may couple to (e.g., contact, engage) the contacts in either the first and second top rows 116, 118 or the first and second bottom rows of the plug 104, depending on how the plug 104 is rotated when the plug 104 is inserted into the receptacle 150.

Figure 1D:
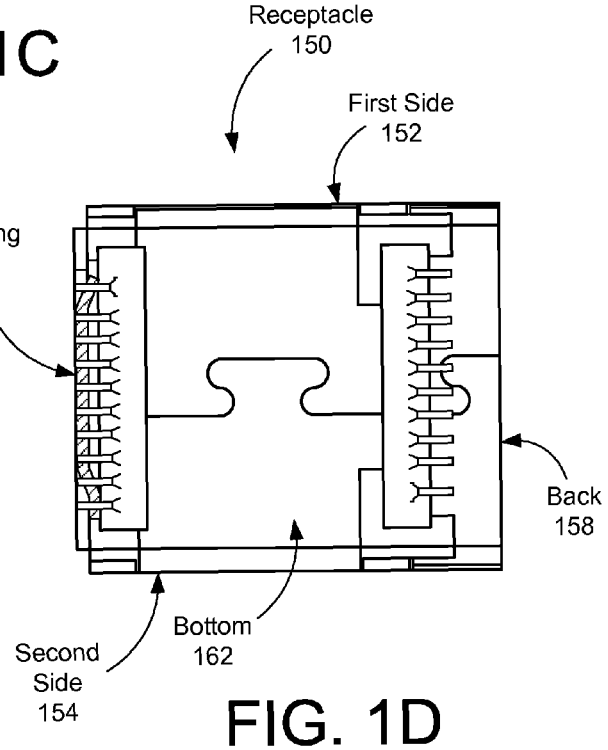
FIG. 1D is a bottom view of the receptacle shown in FIGS. 1A and 1C according to an example embodiment.

FIG. 1D is a bottom view of the receptacle shown in FIGS. 1A and 1C according to an example embodiment. In FIG. 1D, an exterior surface or side (not labeled) of the bottom 162 of the receptacle is shown. As shown in FIG. 1D, the receptacle 150 may include the bottom 162 adjacent to (or coupled to) the first side 152 and the second side 154. The opening 160 may receive the plug 104 (not shown in FIG. 1D), and the back 158 may limit the depth to which the plug 104 may be inserted into the receptacle 150.

Figure 2A:
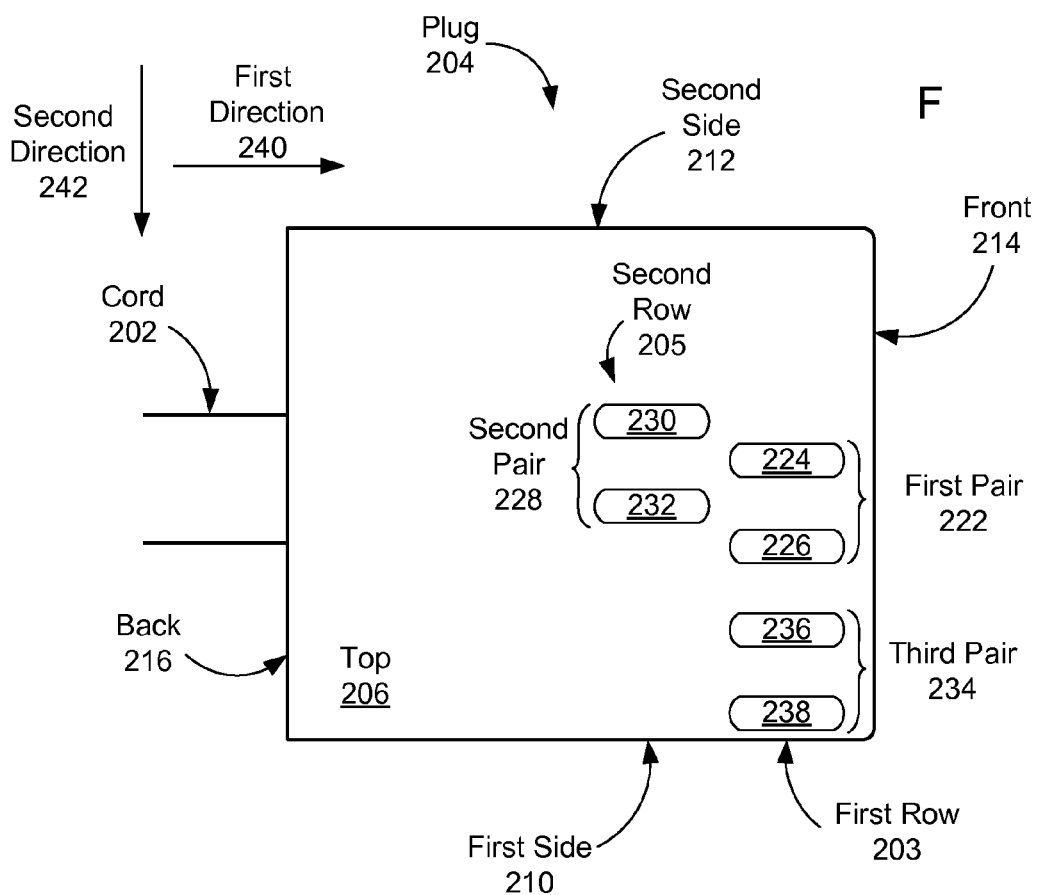
FIG. 2A is a top view of an electrical connector according to an example embodiment.

FIG. 2A is a top view of an electrical connector according to an example embodiment. The electrical connector may include a plug 204 extending from a cord 202 in a first direction 240. FIG. 2A illustrates a second direction 242 orthogonal and/or perpendicular to the first direction 240. The top 206 is aligned parallel to a plane defined by, and/or parallel to both of, the first direction 240 and the second direction 242. The top view is from a perspective looking into the page of the FIG. 2A. The character "F" is included in FIGS. 2A through 2D to illustrate the orientation of the various views.

The cord 202 and plug 204 may have similar features to the cord 102 and plug 104 described above, and the cord 102 and plug 104 may include features described with respect to the cord 202 and plug 204.

The plug 204 may include a top 206. The top 206 may be adjacent to a first side 210 and adjacent to a second side 212. While not shown in FIG. 2A, the plug 204 may also include a bottom (not shown) adjacent to the first side 212 and second side 210, and opposing the top portion 206. The plug 204 may also include a front portion 214 opposite from a back portion 216 and opposite from, and/or distal to, the cord 202. The front 214 may also be adjacent to the top portion 206, the first side 210, the second side 212, and the bottom.

The plug 204 may include a first top row 203 of electrical contacts and a second top row 205 of electrical contacts. The first top row 203 and second top row 205 may extend across the top 206 in the second direction 242, from the first side 210 to the second side 212 and/or from the second side 212 to the first side 210. The second direction 242 may be perpendicular to the first direction 240, and may be parallel to the top portion 206.

The first top row 203 may include a first top differential signaling pair 222. The first top differential signaling pair 222 may include, for example, a Universal Serial Bus (USB) 3.0 or 3.1 differential transmission pair or differential reception pair. The first top differential signaling pair 222 may, for example, include a first top contact 224 and a second top contact 226, one of which may carry positive signals and the other negative signals.

The second top row 205 may include a second top differential signaling pair 228 including two differential signaling contacts 230, 232. The second top differential signaling pair 228 may include a USB 3.0 or 3.1 differential transmission pair or differential reception pair. The second differential signaling pair 228 may include a third top contact 230 and a fourth top contact 232, one of which may carry positive signals and the other negative signals. In an example in which the first top pair 222 includes a differential transmission pair, the second top pair 228 may include a differential reception pair; in an example in which the first top differential signaling pair 222 includes a differential reception pair, the second top differential signaling pair may include a differential transmission pair. In an example implementation, the first top differential signaling pair 222 and the second top differential signaling pair 228 may be configured to carry, transmit, and/or receive signals according to a first communication protocol, such as USB 3.0 and/or USB 3.1, or DisplayPort.

The first row 203 may also include a third top differential signaling pair 224 of differential signaling contacts. The third differential signaling pair 234 may be configured to carry, transmit, and/or receive according to a second communication protocol. The second communication protocol, which may include USB 2.0, may have a lower data rate than the first communication protocol. The third differential signaling pair 234 may include a fifth top signaling contact 236 and a sixth top signaling contact 238. One of the fifth top signaling contact 236 and sixth top signaling contact 238 may carry positive signals and the other negative signals. While differential signaling pairs 222, 228, 234 have been referred to as a first differential signaling pair 222, a second differential signaling pair 228, and third differential signaling pair 234, other descriptions may be used; for example, the differential signaling pair 234 may be referred to as a second differential signaling pair and the differential signaling pair 228 may be referred to as a third differential signaling pair.

Figure 2B:
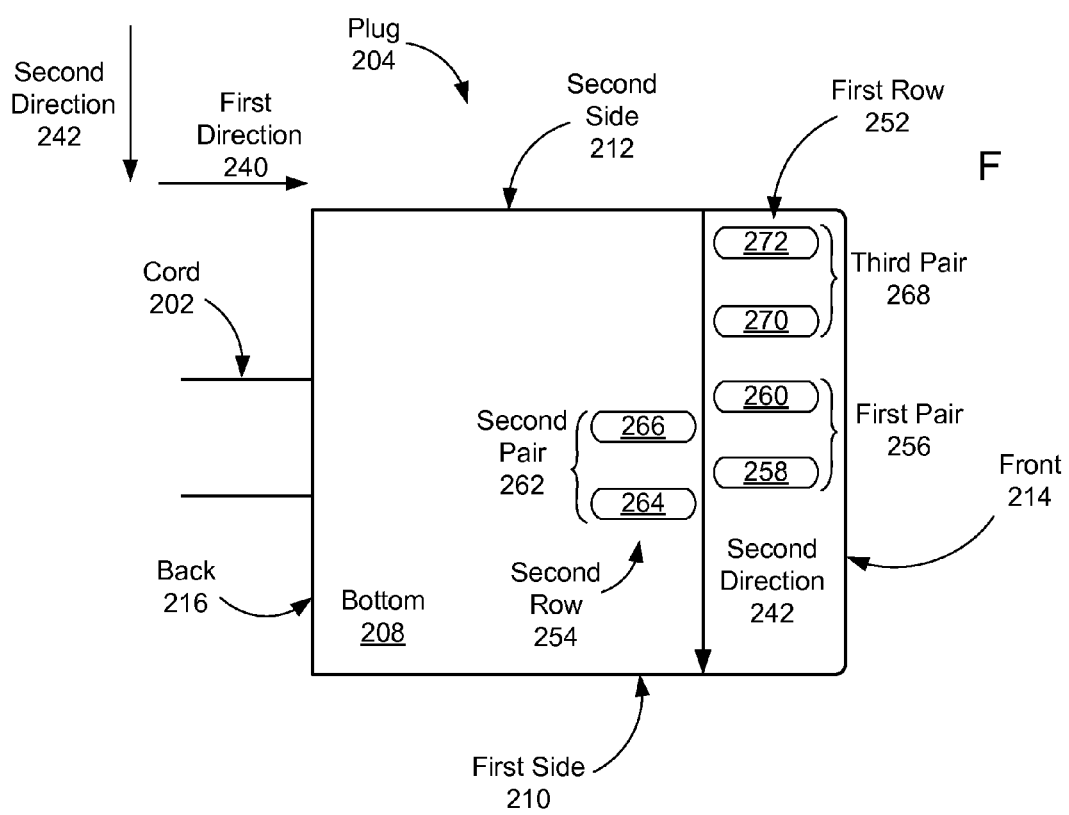
FIG. 2B is a top cross-sectional view of the electrical connector shown in FIG. 2A according to an example embodiment.

FIG. 2B is a top cross-sectional view of the electrical connector shown in FIG. 2A according to an example embodiment. The cross-sectional view in FIG. 2B is a cut along a plane defined by the first direction 240 and the second direction 242. Accordingly, the cut is through the front 214, back 216, first side 210, and second side 212 of the plug 204. The view in FIG. 2B is viewed from the same perspective of the plug 204 as FIG. 2A—looking into the page. Accordingly, the character "F" is in the same orientation as in FIG. 2A.

The bottom 208 of the plug 204 may include a first bottom row 252 of electrical contacts extending across the bottom 208 in the second direction 242 and a second bottom row 254 of electrical contacts extending across the bottom 208 in the second direction 242. The contacts included in the first and second bottom rows 252, 254 may face away from the plug 204 and/or away from the top 206 (not shown in FIG. 2B).

The first bottom row 252 may be mirrored to, and have a same distance from the front portion 214 as, the first top row 203 (not shown in FIG. 2B). The second bottom row 254 may be mirrored to, and have a same distance from the front portion 214 as, the second top row 204 (not shown in FIG. 2B), enabling the plug 204 to maintain functionality when rotated one hundred and eighty degrees about an axis parallel to the first direction 240.

The first row 252 may include a first bottom differential signaling pair 256. The first bottom differential signaling pair 256 has similar features to, and may be coupled to, the first top differential signaling pair 222. A first bottom contact 258 included in the first bottom differential signaling pair 256 may be coupled to the first top contact 224 and a second bottom contact 260 included in the first bottom differential signaling pair 256 may be coupled to the second top contact 226, or the first bottom contact 258 may be coupled to the second top contact 226 and the second bottom contact 260 may be coupled to the first top contact 224. The first differential signaling pairs 222, 256 may still function with their polarities reversed.

The second row 254 may include a second differential signaling pair 262, which may have similar features to, and may be coupled to, the second top differential signaling pair 228. The second pair 262 of differential signaling contacts may be coupled to the second top pair 228 of differential signaling contacts. A third bottom contact 264 included in the second bottom differential signaling pair 262 may be coupled to the third top contact 230 and a fourth bottom contact 266 included in the second bottom differential signaling pair 262 may be coupled to the fourth top contact 232, or the third bottom contact 264 may be coupled to the fourth top contact 232 and the fourth bottom contact 266 may be coupled to the third top contact 230, with functionality being maintained with polarities of the second differential signaling pairs 228, 262 being reversed.

The first bottom row 252 may also include a third differential signaling pair 268. The third bottom differential signaling pair 268 may be coupled to the third top differential signaling pair 234. The third bottom differential signaling pair 268 may include a fifth bottom contact 270 coupled to the fifth top contact 236 and a sixth bottom contact 272 coupled to the sixth top contact 238.

Figure 2C:
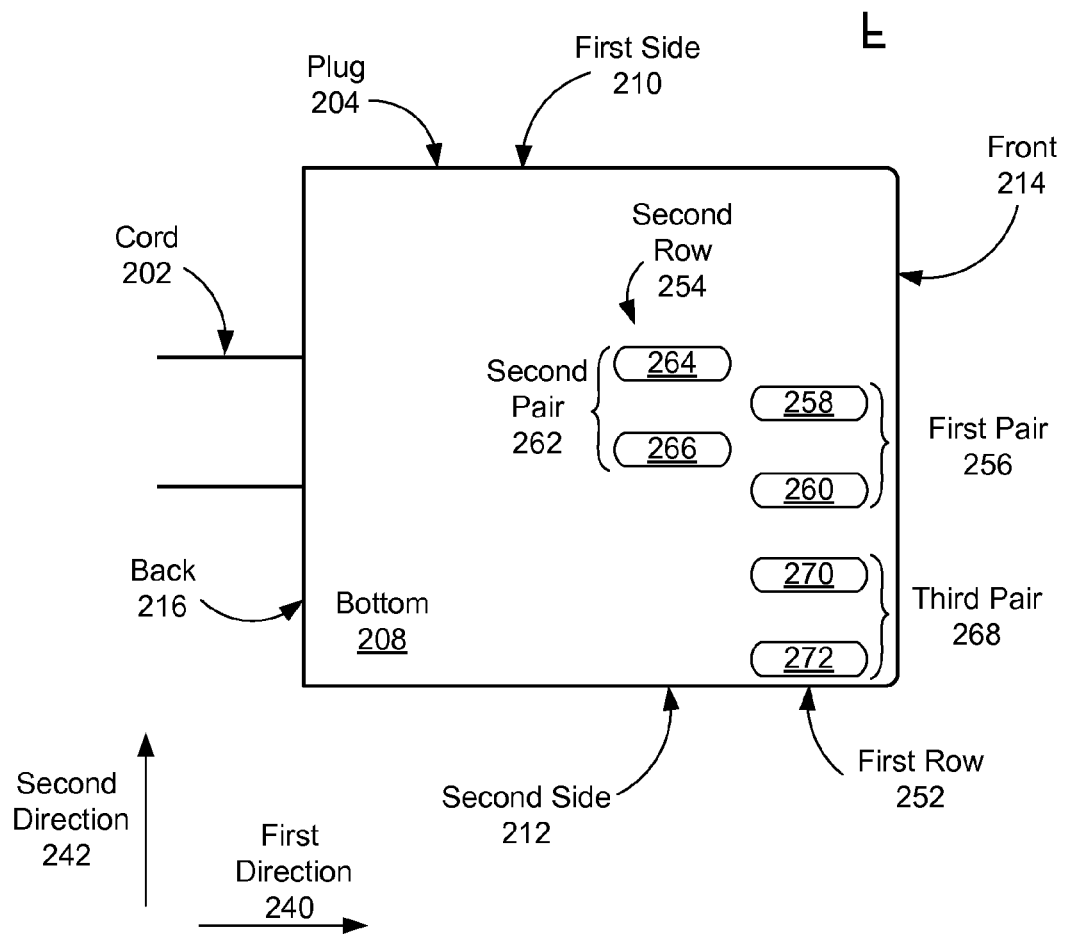
FIG. 2C is a bottom view of the electrical connector shown in FIGS. 2A and 2B according to an example embodiment.

FIG. 2C is a bottom view of the electrical connector shown in FIGS. 2A and 2B according to an example embodiment. The character "F" is flipped upside down to illustrate that the view in FIG. 2C is flipped one hundred and eighty degrees from the views in FIGS. 2A and 2B.

As shown in FIG. 2C, the bottom view of the plug 204 shows the electrical contacts 258, 262, 264, 266, 270, 272 arranged in a similar manner as the electrical contacts 224, 226, 230, 232, 236, 238 on the top 206 of the plug 204. This similar arrangement on the top 206 and the bottom 208 may enable the plug 204 maintain functionality when the plug 204 is rotated one hundred and eighty degrees.

Figure 2D:
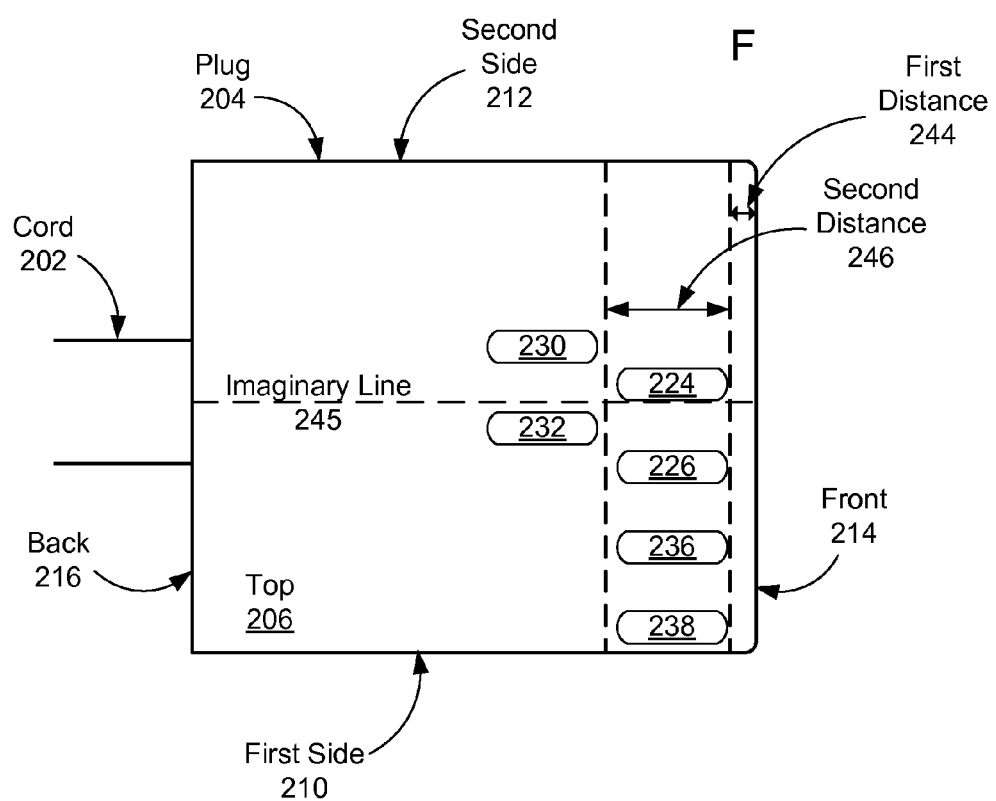
FIG. 2D is another top view of the electrical connector shown in FIGS. 2A, 2B, and 2C according to an example embodiment.

FIG. 2D is another top view of the electrical connector shown in FIGS. 2A, 2B, and 2C according to an example embodiment. This top view, because it is from the same perspective as FIG. 2A, includes the same elements as FIG. 2A. While the arrangements of contacts are described with respect to contacts on the top portion 206 of the plug 204, the contacts on the bottom 208 (not shown in FIG. 2D) may also be arranged in the manner described with respect to FIG. 2D.

An imaginary line 245, which may also be considered a line and/or axis, may extend across the top 206 of the plug 204 in the first direction 240 (not shown in FIG. 2D), and may be equidistant to the first side 210 and the second side 212. As shown in FIG. 2D, the electrical contacts, 224, 226 included in the first differential pair 222 of the first top row 203 may be closer to the imaginary line 245 than the remaining electrical contacts in the first top row 203, such as contacts 236, 238. In an example in which the first top row 203 includes additional contacts beyond 224, 226, 236, 238, the imaginary line 244 may extend through the center of the first top row 203, and the contacts 224, 226 in the first top differential signaling pair 222 may be closer to the center of the first top row 203 than remaining contacts in the first top row 203. The first top row 203 may also include additional contacts besides the fifth and sixth top contacts 236, 238 which are farther from the imaginary line 245 than the first and second top contacts 224, 226 included in the first top differential signaling pair 222.

The top contacts 230, 232 in the second differential pair 228 may also be closer to the imaginary line 245 than any other contacts (not shown in FIG. 2D) in the second top row 205. The imaginary line 244 may extend through a center of the second top row 205, and the contacts 230, 232 in the second differential signaling pair 228 may be closer to the center of the second top row 205 than remaining contacts in the second top row 205. The location of the electrical contacts 224, 226, 230, 232 which carry signals according to the first communication protocol closer to the center of their respective rows 203, 205 and/or closer to the imaginary line 245 extending across the center of the top 206 of the plug 204, may reduce the length of the wires coupling the top contacts 224, 226, 230, 232 to the corresponding bottom contacts 258, 260, 264, 266, reducing delay and/or latency in the higher speed differential transmission pairs.

As shown in FIG. 2D, the top contacts 224, 226, 236, 238 in the first top row 203 may be a first distance 224 from the front 214 of the plug 204. The top contacts 230, 232 in the second top row 205 may be a second distance 246 from the front 214 of the plug 204. The second distance 246 may be greater than the first distance 244. The first bottom row 252 of contacts may also be the same, first distance 244 from the front 214 of the plug 204 as the first top row 203 of contacts. The second bottom row 254 of contacts may also have the same, second distance 246 from the front 214 of the plug 204 as the second top row 205 of contacts.

Figure 2E:
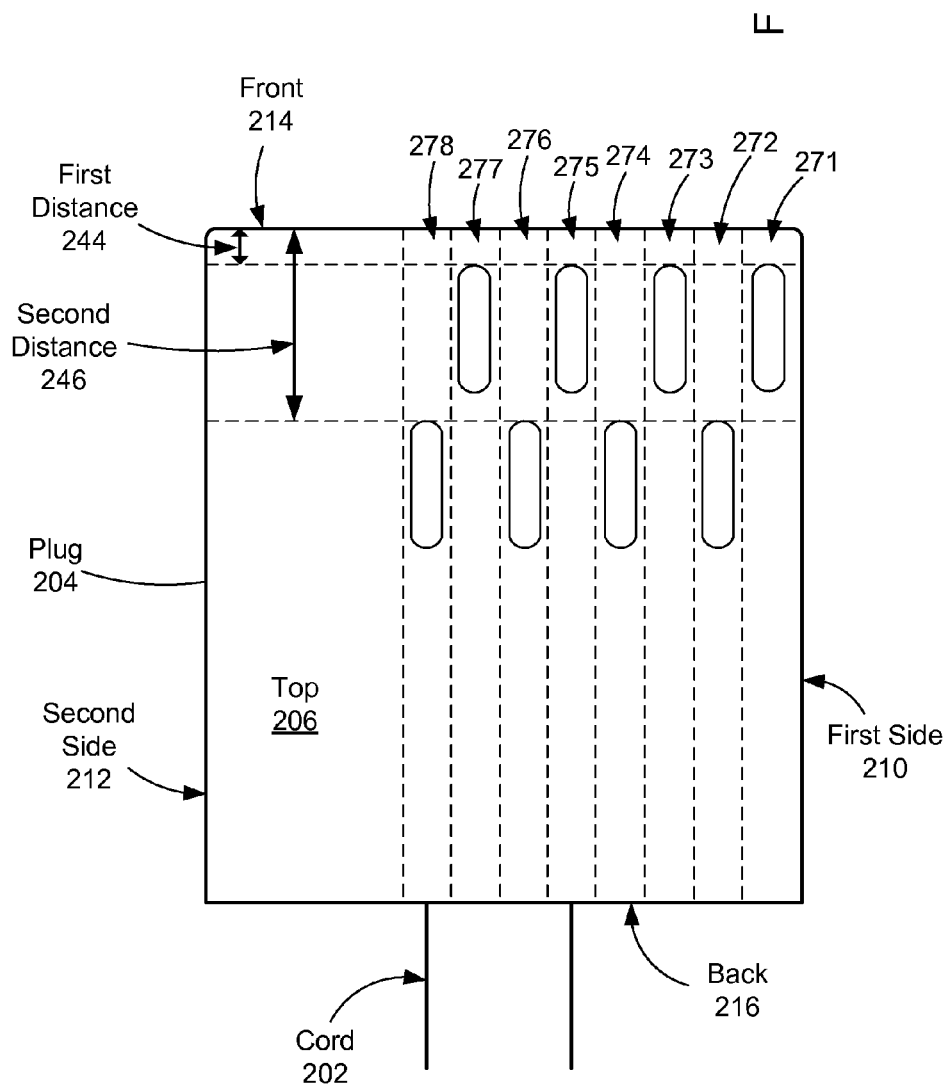
FIG. 2E is another top view of the electrical connector shown in FIGS. 2A, 2B, 2C, and 2D according to an example embodiment.

FIG. 2E is another top view of the electrical connector shown in FIGS. 2A, 2B, 2C, and 2D according to an example embodiment. The character "F" is rotated in a counter-clockwise fashion to illustrate the orientation of FIG. 2E. While six contacts 224, 226, 230, 232, 236, 238 258, 260, 266, 264, 270, 272 were shown on each of the top 206 and bottom 208, eight contacts are shown in FIG. 2E for the purpose of showing the staggering of the contacts. While the arrangements of contacts in FIG. 2E are described with respect to contacts on the top portion 206 of the plug 204, the contacts on the bottom 208 (not shown in FIG. 2E) may also be arranged in the manner described herein with respect to FIG. 2E.

As shown in FIG. 2E, contacts on the top 206 of the plug 204 may be arranged in a plurality of columns 271 through 278. Contacts in adjacent columns 271 through 278 may alternate between being the first distance 244 from the front 214 of the plug 204 and the second distance 246 from the plug 204. In the example shown in FIG. 2E, the contact in the first column 271 is the first distance 244 from the front 214, the contact in the second column 272 is the second distance 246 from the front 214, the contact in the third column 273 is the first distance 244 from the front 214, the contact in the fourth column 274 is the second distance 246 from the front 214, the contact in the fifth column 275 is the first distance 244 from the front 214, the contact in the sixth column 276 is the second distance 246 from the front 214, the contact in the seventh column 277 is the first distance 244 from the front 214, and the contact in the eighth column 278 is the second distance 246 from the front 214. In an example embodiment, contacts in the first top row 203 (not labeled in FIG. 2E) may be the first distance 244 from the front portion 214, and contacts in the second top row 205 (not labeled in FIG. 2E) may be the second distance from the front portion 214. While FIG. 2E shows each of the top rows 203, 205 including four contacts, the top rows 203, 205 (and corresponding bottom rows 252, 254) may each include more or fewer than four contacts.

Contacts on the bottom 208 (not labeled in FIG. 2E) of the plug 204 may be arranged in a similar manner to the contacts on the top 206. In an example embodiment, contacts on the top 206 of the plug 204 may be coupled to contacts on the bottom 208 of the plug 204 which are in columns with the same ordinal number, with the columns in the bottom 208 being ordered starting from an opposite side 210, 212 as the columns 271 through 278 on the top 206. In the example shown in FIG. 2E, the columns 271 through 278 on the top 206 are ordered from the first side 210 to the second side 212, and the columns on the bottom 208 may be ordered from the second side 212 to the first side 210. The contact in the first column 271 of the top 206 of the plug 204 may be coupled to a contact in a first column on the bottom 208 of the plug 204, a contact in the second column 272 of the top 206 of the plug 204 may be coupled to a contact in a second column of the bottom 208 of the plug 204, the contact in the third column 273 of the top 206 of the plug 204 may be coupled to a contact in a third column of the bottom 208 of the plug 204, the contact in the fourth column 274 of the top 206 of the plug 204 may be coupled to a contact in a fourth column of the bottom 208 of the plug 204, the contact in the fifth column 275 of the top 206 of the plug 204 may be coupled to a contact in a fifth column of the bottom 208 of the plug 204, the contact in the sixth column 276 of the top 206 of the plug 202 may be coupled to a contact in a sixth column of the bottom 208 of the plug 204, the contact in the seventh column 277 of the top 206 of the plug 204 may be coupled to a contact in a seventh column of the bottom 208 of the plug 204, and the contact in the eighth column 278 of the top 206 of the plug 204 may be coupled to a contact in an eighth column of the bottom 208 of the plug 204. Contacts on the bottom 208 of the plug 204 may also have a same distance from the second side portion 212 as the contacts on the top 206 with a same ordinal number have from the first side 210, and may have a same distance from the front 214 as the contact with the same ordinal number on the top 206 of the plug 204.

Figure 3A:
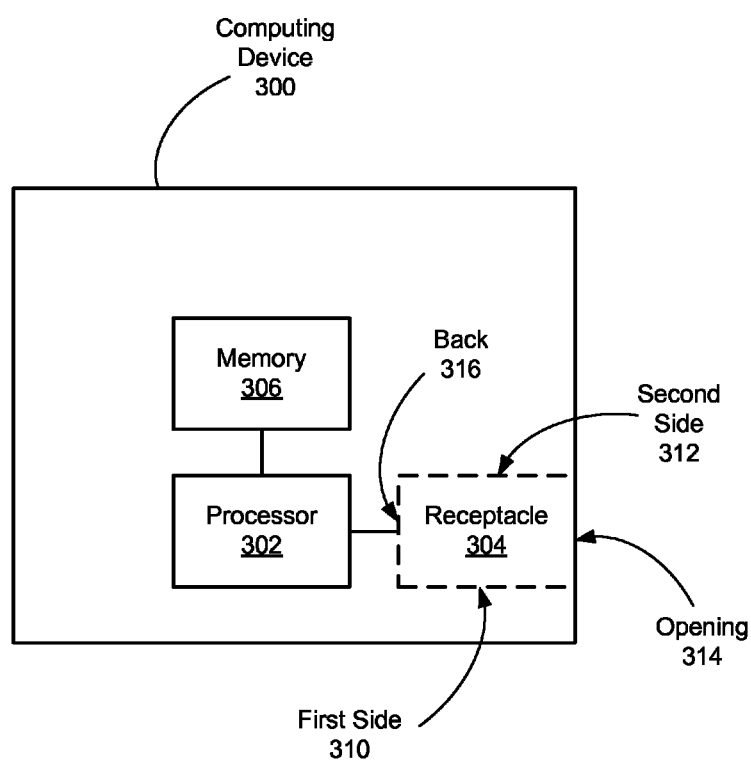
FIG. 3A is a schematic diagram of a computing device including a receptacle according to an example embodiment.

FIG. 3A is a schematic diagram of a computing device 300 according to an example embodiment. The computing device 300 may include a processor 302. The processor 302 may be configured to execute instructions and perform operations based on the instructions. The processor 302 may, for example, be configured to encode data into signals according to any of the communication protocols described herein, and decode signals from any of the communication protocols describe herein into data. The processor 302 may be coupled to a receptacle 304 and to a memory 306. The memory 306 may store data and instructions, such as instructions executed by the processor 302.

As shown in FIG. 3A, the computing device 300 also includes a receptacle 304. The receptacle 304 may have similar features to the receptacle 150 described above with respect to FIGS. 1A, 1C and 1D. The receptacle 304 may include an opening 314 for receiving a plug, such as the plug 104 and/or plug 204 described above. The receptacle 304 may also include a first side 310 adjacent to the opening 314, a second side 312 adjacent to the opening 314 and opposite from the first side 310, and a back 316 adjacent to the first side 310 and second side 312. The receptacle 304 may include similar features to the receptacle 150 described above, and/or the receptacle 150 may include similar features to the receptacle 304 described herein. While not shown in FIG. 3A, the receptacle 304 may also include a top portion adjacent to the opening 314, first side 310, second side 312, and back 316, and a bottom portion adjacent to the opening 314, first side 310, second side 312, and back 316 and opposite from the top portion.

Figure 3B:
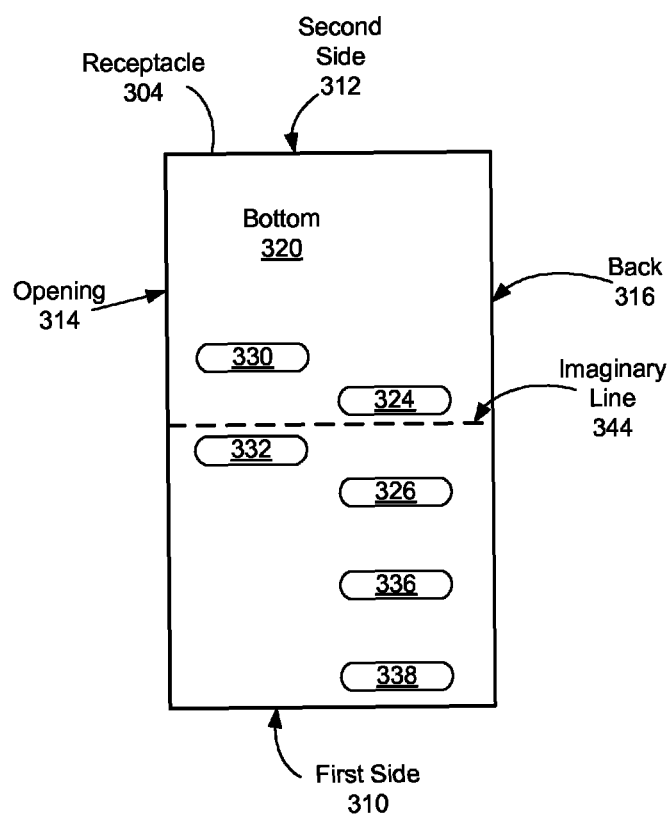
FIG. 3B is a cross-sectional view of the receptacle included in the computing device shown in FIG. 3A according to an example embodiment.

FIG. 3B is a cross-sectional view of the receptacle 304 included in the computing device 300 shown in FIG. 3A according to an example embodiment. The cross-section may be taken anywhere between a top (not shown in FIG. 3B) and a bottom 320 of the receptacle 304. The receptacle 304 may include electrical contacts on a side of the receptacle 304, such as on the bottom 320 of the receptacle 304. The electrical contacts may be included on a side other than the bottom 320, such as the top (not shown in FIG. 3B), first side 310, or second side 312, according to example embodiments.

The receptacle 304 may include a first row of receptacle contacts 324, 326, 336, 338 and a second row of receptacle contacts 330, 332. The first receptacle row of contacts may correspond to, and/or include contacts 324, 326, 336, 338 in a similar arrangement to, the first top row 203 and/or first bottom row 252 shown in FIGS. 2A and 2B. The second row of receptacle contacts may correspond to, and/or include contacts 330, 332 in a similar arrangement to, the second top row 205 and/or second bottom row 254 shown in FIGS. 2A and 2B. While six receptacle contacts 324, 326, 330, 332, 336, 338 are shown in the example of FIG. 3B, more or fewer contacts may be included in each of the first and second receptacle rows.

The first row of contacts may include a first receptacle differential signaling pair, which may include a first receptacle contact 324 and a second receptacle contact 326. The first receptacle differential signaling pair may correspond to the first differential signaling pairs 222, 256, and receive and/or transmit data according to the first communication protocol. When the plug 102, 204 is inserted into the receptacle 304, the first receptacle contact 324 may couple (or contact) with either the first top contact 224 or the first bottom contact 258, and the second receptacle contact 326 may couple (or contact) with either the second top contact 226 or the second bottom contact 260, depending on the orientation of the plug.

In an example embodiment, the first receptacle differential signaling pair, which includes the first and second receptacle contacts 324, 326, may be closer to an imaginary line 344 than remaining contacts in the first receptacle row. The imaginary line 344 may extend along a center of the bottom 320 (or other side that includes the contacts 324, 326, 330, 332, 336, 338) of the receptacle 304 and/or may be equidistant from two sides adjacent to the side along which the rows of electrical contacts extends, such as the first side 310 and second side 312 of the receptacle 304. In an example in which the first receptacle row includes contacts beyond 324, 326, 336, 338, the imaginary line 344 may extend through a center of the first receptacle row, and the contacts 324, 326 in the first receptacle differential signaling pair may be closer than remaining contacts in the first receptacle row.

The second receptacle row of receptacle contacts may correspond to, and/or include contacts 330, 332 in a similar arrangement to, the second top row 205 and second bottom row 254. The second receptacle row of contacts may include a second receptacle differential signaling pair. The second receptacle differential signaling pair may carry signals transmitting and/or receiving data according to the first communication protocol. The second receptacle differential signaling pair may include a third receptacle contact 330 and a fourth receptacle contact 332. The third receptacle contact 330 and fourth receptacle contact 332 included in the second receptacle differential signaling pair may be closer to the imaginary line 344 than remaining contacts (not shown in FIG. 3B) in the second receptacle row. The imaginary line 344 may extend through a center of the second receptacle row, and the contacts 330, 332 in the second receptacle differential signaling pair may be closer to the center of the second receptacle row than remaining contacts in the second receptacle row. When the plug 102, 204 is inserted into the receptacle 304, the third receptacle contact 330 may couple with either the third top contact 230 or the third bottom contact 264, and the fourth receptacle contact 332 may couple with either the fourth top contact 232 or the fourth bottom contact 266, depending on the orientation of the plug 104, 204.

The first receptacle row of contacts may also include a third receptacle differential signaling pair. The third receptacle differential signaling pair may include a fifth receptacle contact 336 and a sixth receptacle contact 338. The fifth receptacle contact 336 and sixth receptacle contact 338 may both be farther from the imaginary line 344 than either of the first and second receptacle contacts 324, 326 included in the first receptacle differential pair. The third receptacle differential signaling pair may correspond to the third top differential signaling pair 234 and third bottom differential signaling pair 268, and may carry signals according to the second communication protocol, which may have a lower data rate than the first communication protocol.

In an example embodiment, the imaginary line 344 may also represent a plane extending both toward and away from the reader. The plane may be orthogonal to the opening 314. The plane may bisect the opening 314. The first receptacle differential signaling pair, and/or first pair of signaling contacts 324, 326, may be intersected by the plane. The second receptacle differential signaling pair, and/or second pair of signaling contacts 336, 338, may be disposed entirely on one side of the plane, such as closer to the first side 310 than to the second side 312. The third receptacle differential signaling pair, and/or third pair of signaling contacts 330, 332, may be intersected by the plane.

The first and second receptacle differential pairs may transmit and/or receive data according to the first communication protocol. The first communication protocol may include, for example, USB 3.0, USB 3.1, and/or DisplayPort. In an example implementation, the first receptacle differential pair may transmit data according to the first communication protocol, and the second receptacle differential pair may receive data according to the first communication protocol. According to another example embodiment, the first receptacle differential pair may receive data according to the first communication protocol, and the second receptacle differential pair may transmit data according to the first communication protocol.

Figure 3C:
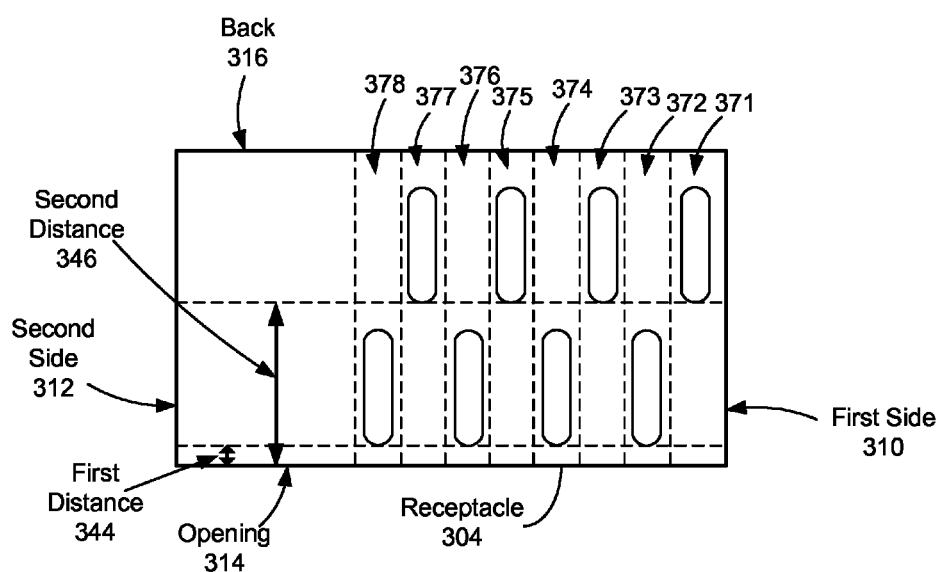
FIG. 3C is another cross-sectional view of the receptacle shown in FIGS. 3A and 3B according to an example embodiment.

FIG. 3C is another cross-sectional view of the receptacle 304 shown in FIGS. 3A and 3B according to an example embodiment. FIG. 3C shows the receptacle 304 rotated ninety degrees counter-clockwise with respect to FIG. 3B. While six contacts 324, 326, 330, 332, 336, 338 are shown in FIG. 3B, FIG. 3C shows eight contacts for purpose of showing the staggering of the contacts. In this example, the contacts in the receptacle 304 may be arranged into a plurality of receptacle columns 371 through 378. The receptacle columns 371 through 378 may correspond to, and have similar features to, the columns 271 through 278 on each of the top 206 and bottom 208 of the plug 204. The electrical contacts in adjacent columns 371 through 378 of the receptacle 304 may alternate between being a first distance 344 and a second distance 346 from the opening 314 of the receptacle 304. In the example shown in FIG. 3C, the distances are measured from an end of the contacts that is proximal to the opening 314; however, the distances 344, 346 may also be measured from middle, center, or distal portions. In this example, contacts in columns with an odd ordinal number may be the first distance 344 from the opening 314 and contacts columns with an even ordinal number may be the second distance 346 from the opening 314. In another example embodiment, contacts in columns with an odd ordinal number may be the second distance 346 from the opening 314, and contacts in columns with an even ordinal number maybe the first distance 344 from the opening 314. In the example shown in FIG. 3C, a contact in the first column 371 may be the second distance 346 from the opening 314, a contact in the second column 372 may be the first distance 344 from the opening 314, a contact in the third column 373 may be the second distance 346 from the opening 314, a contact in the fourth column 374 may be the first distance 344 from the opening 314, a contact in the fifth column 375 may be the second distance 346 from the opening 314, a contact in the sixth column 376 may be the first distance 344 from the opening 314, a contact in the seventh column 377 may be the second distance 346 from the opening 314, and a contact in the eighth column 378 may be the first distance 344 from the opening 314. The arrangement of the contacts as shown in FIGS. 3A, 3B may correspond to the arrangement of the contacts of the plug 204 shown in FIGS. 2A, 2B, 2C, 2D and 2E. While four contacts are shown at each distance 344, 346 from the opening 314, more or fewer contacts may be included in the receptacle 304.

Figure 4A:
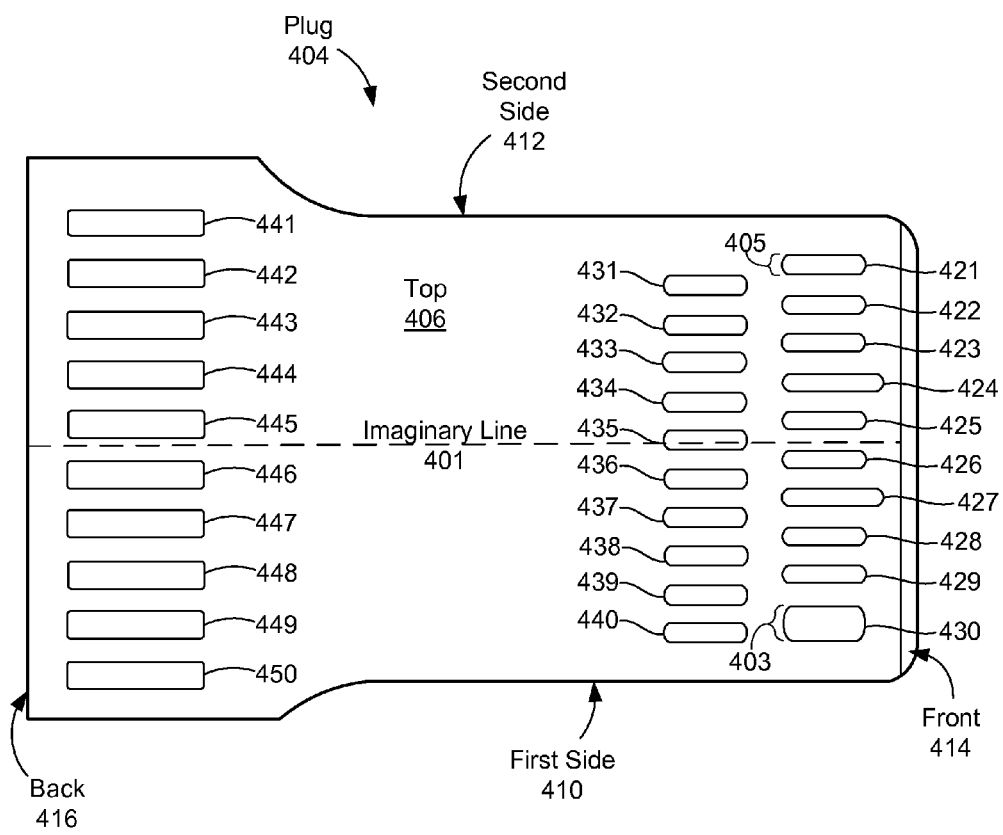
FIG. 4A is a top view of a plug according to an example embodiment.

FIG. 4A is a top view of a plug 404 according to an example embodiment. The plug 404 may have similar features to the plugs 104, 204 described above, and/or the plugs 104, 204 may have features described below with respect to the plug 404. The plug 404 may include a plurality of top cord contacts 441 through 450. The top cord contacts 441 through 450 may be proximal to a back 416 of the plug 404, and/or closer to the back 416 of the plug 404 than remaining contacts on the plug 404. The cord contacts 441 through 450 (and the cord contacts 471 through 480 shown in FIG. 4B) may couple to, and/or form terminal ends of, the wires in the cord. The top cord contacts 441 through 450 may be coupled to wires in a cord, such as either cord 102, 202, from which the plug 404 extends. The cord from which the plug 404 extends may have similar features to either of the cords 102, 202 described above.

The plug 404 may also include two rows of top contacts on the top 406 of the plug 404. The two rows of top contacts may extend in a direction perpendicular to the direction from which the plug 404 extends from the cord, as described above with respect to FIG. 2A.

In the example shown in FIG. 4A, a first top row of contacts may include top contacts 421 through 430. In an example embodiment, top contacts 425, 426 may correspond to, and have similar features to, first and second top contacts 224, 226, and may form a first top differential signaling pair for transmitting and/or receiving signals according to the first communication protocol, such as USB 3.0, USB 3.1, and/or DisplayPort. The top contacts 425, 426 may be closer to an imaginary line 401 extending across a center of the top 406, and/or equidistant to the first side 410 and second side 412, of the plug 404 than the remaining top contacts 421 through 430 in the first top row. The imaginary line 401 may also extend through a center of the first top row and through a center of the second top row. Top contacts 428, 429 may correspond to, and have similar features to, fifth and sixth top contacts 326, 238, and may form a third top differential pair for transmitting and/or receiving signals according to the second communication protocol, such as USB 2.0.

The top contacts 424, 427 may include top ground contacts 424, 427. One of the top ground contacts 427 may be located between the first top differential pair and the third top differential pair, and/or between and/or adjacent to the second top contact 426 and the fifth top contact 428. Another top ground contact 424 may be adjacent to the first top contact 425. The top ground contacts 424, 427 may be longer than remaining top contacts, 421, 422, 423, 425, 426, 428, 429, 430 in the first row, and/or may be closer to the front portion 414 of the plug 404 than the remaining top contacts, 421, 422, 423, 425, 426, 428, 429, 430. The relative closeness of the top ground contacts 424, 427 compared to the remaining top contacts 421, 422, 423, 425, 426, 428, 429, 430 in the first row may cause the top ground contacts to contact and/or couple with contacts in the receptacle before the remaining top contacts 421, 422, 423, 425, 426, 428, 429, 430 make contact and/or couple, grounding the plug 404 before signals are transferred.

The first top row may also include a VBUS node or power node 430. The power node 430 may carry current or power from the electrical device coupled to the cord, through the plug 404, to the computing device through the receptacle, and/or may carry current or power form the computing device through the receptacle, through the plug 404, to the electrical device coupled to the cord. The power node 430 may be adjacent to the sixth top contact 429, and may be closer to the first side 410 than the remaining contacts 421 through 429 in the first top row. The power node 430 may be wider than the remaining contacts 421 through 429 in the first top row, increasing the current that may flow through the power node 430. The power contact 430 may, for example, have a width 403 that is twice as wide or at least twice as wide as a width 405 of the remaining contacts 421 through 429 in the first top row. The power contact 430 may also have a greater surface area than, such as twice as much surface area or at least twice as much surface area as, the remaining contacts 421 through 429 in the first top row.

The first top row may also include a USB identifier contact 423 adjacent to the ground contact 424. A top contact 422 may be used for operations determined by an operator of the plug 404 and/or system. A USB communication channel contact 421 may be adjacent to the top contact 422, and may be closer to the second side 412 than the remaining contacts 422 through 430 in the first top row.

The second top row may include contacts 431 through 440. The second top row may include top contacts 435, 436, which may correspond to, and have similar features to, the third and fourth top contacts 230, 232 and form second top differential signaling pair for transmitting and/or receiving signals according to the first communication protocol, such as USB 3.0, USB 3.1, and/or DisplayPort. In an example in which the top contacts 425, 426 form a differential transmission pair, the top contacts 435, 436 may form a differential reception pair; in an example in which the top contacts 425, 426 form a differential reception pair, the top contacts 435, 436 may form a differential transmission pair. The top contacts 435, 436 may be closer to the imaginary line extending across the center of the top 406 of the plug 404 than remaining top contacts 431 through 440 in the second top row.

The second top row may also include ground contacts 434, 437. The ground contacts 434, 437 may be adjacent to the top contacts 434, 436. Top contacts 438, 439 may include a differential transmission pair which transmits signals according to a third communication protocol, and top contacts 432, 433 may include a differential reception pair which receives signals according to the third communication protocol, according to an example embodiment. According to another example embodiment, top contacts 438, 439 may include a differential reception pair which receives signals according to the third communication protocol, and top contacts 432, 433 may include a differential transmission pair which transmits signals according to the third communication protocol. The second top row may also include a USB communication channel contact 431. The USB communication channel contact 431 may be closer to the second side 412 of the plug than any of the other top contacts 432 through 440 in the second row. The second top row may also include a VBUS or power node 440. The power node 440 may carry current or power from the electrical device coupled to the cord, through the plug 404, to the computing device through the receptacle, and/or may carry current or power form the computing device through the receptacle, through the plug 404, to the electrical device coupled to the cord. In an example embodiment, the power node 440 may be coupled to the power node 430, and the power nodes 430, 440 may combine to carry current or power from the electrical device coupled to the cord, through the plug 404, to the computing device through the receptacle, and/or may carry current or power form the computing device through the receptacle, through the plug 404, to the electrical device coupled to the cord.

The top cord contacts 441 through 450 may be coupled to some, such as half, of the top contacts 421 through 440, and to corresponding bottom contacts described below with respect to FIG. 4B. The top contacts 421 through 440 that are not coupled to a top cord contact 441 through 450 may be coupled to a bottom cord contact, shown and described with respect to FIG. 4B. In an example embodiment, top cord contact 441 may be coupled to top power contact 440, top cord contact 442 may be coupled to top contact 432, top cord contact 443 may be coupled to top contact 433, top cord contact 444 may be coupled to top contact 434, top cord contact 445 may be coupled to third top contact 435, top cord contact 446 may be coupled to fourth top contact 436, top cord contact 447 may be coupled to top contact 437, top cord contact 448 may be coupled to first top contact 425, top cord contact 449 may be coupled to second top contact 426, and top cord contact 450 may be coupled to power contact 430. Other couplings may be implemented.

Figure 4B:
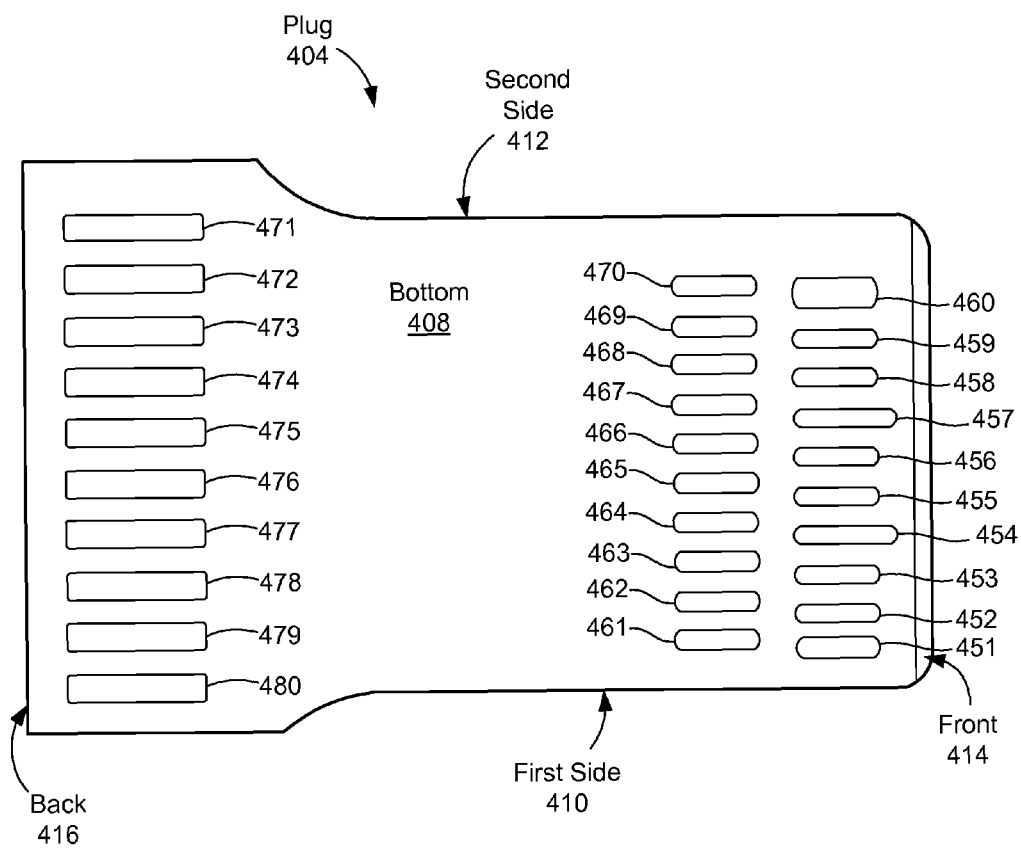
FIG. 4B is a top cross-sectional view of the plug shown in FIG. 4A according to an example embodiment.

FIG. 4B is a top cross-sectional view of the plug 404 shown in FIG. 4A according to an example embodiment. This view, which has the same orientation as FIG. 4A, shows contacts on the bottom 408 of the plug 404. The bottom contacts 451 through 470 may face away from the bottom 408 of the plug 404.

The plug 404 may include bottom cord contacts 471 through 480, which may be coupled to the top contacts 421 through 440 and corresponding bottom contacts that are not coupled to a top cord contact 441 through 450. In an example embodiment, bottom cord contact 471 may be unused or have a use or coupling determined by an operator of the plug 404 or a system in which the plug 404 is used, bottom cord contact 472 may be unused or have a use or coupling determined by an operator of the plug 404 or a system in which the plug 404 is used, bottom cord contact 473 may be coupled to the top contact 428, bottom cord contact 474 may be coupled to the ground contact 424, bottom cord contact 475 may be coupled to fourth top contact 429, bottom cord contact 476 may be coupled to third top contact 428, bottom cord contact 477 may be coupled to ground contact 427, bottom cord contact 478 may be coupled to top contact 463, bottom cord contact 479 may be coupled to top contact 462, and bottom cord contact 480 may be coupled to bottom contact 461 and/or bottom contact 451.

The bottom 408 may include a first bottom row of contacts including contacts 451 through 460 which are mirrored to the first top row of contacts shown and described with respect to FIG. 4A. In the first bottom row, bottom contact 451 may be coupled to top contact 421, bottom contact 452 may be coupled to top contact 422, bottom contact 453 may be coupled to top contact 423, bottom contact 454 may be coupled to top contact 424, bottom contact 455 may be coupled to top contact 425, bottom contact 456 may be coupled to top contact 426, bottom contact 457 may be coupled to top contact 427, bottom contact 458 may be coupled to top contact 428, bottom contact 459 may be coupled to top contact 429, and bottom contact 460 may be coupled to top contact 460.

The bottom 408 may also include a second bottom row of contacts 461 through 470 which are mirrored to the second top row of contacts shown and described with respect to FIG. 4A. In the second bottom row, bottom contact 461 may be coupled to top contact 431, bottom contact 462 may be coupled to top contact 432, bottom contact 463 may be coupled to top contact 433, bottom contact 464 may be coupled to top contact 434, bottom contact 465 may be coupled to top contact 435, bottom contact 466 may be coupled to top contact 436, bottom contact 467 may be coupled to top contact 437, bottom contact 468 may be coupled to top contact 438, bottom contact 469 may be coupled to top contact 439, and bottom contact 470 may be coupled to top contact 440. The mirroring of the first and second bottom rows to the first and second top rows, respectively may enable the plug 404 to maintain functionality after being rotated one hundred and eighty degrees around an axis parallel to the direction that the plug 404 extends from the cord (not shown in FIG. 4B).

Figure 4C:
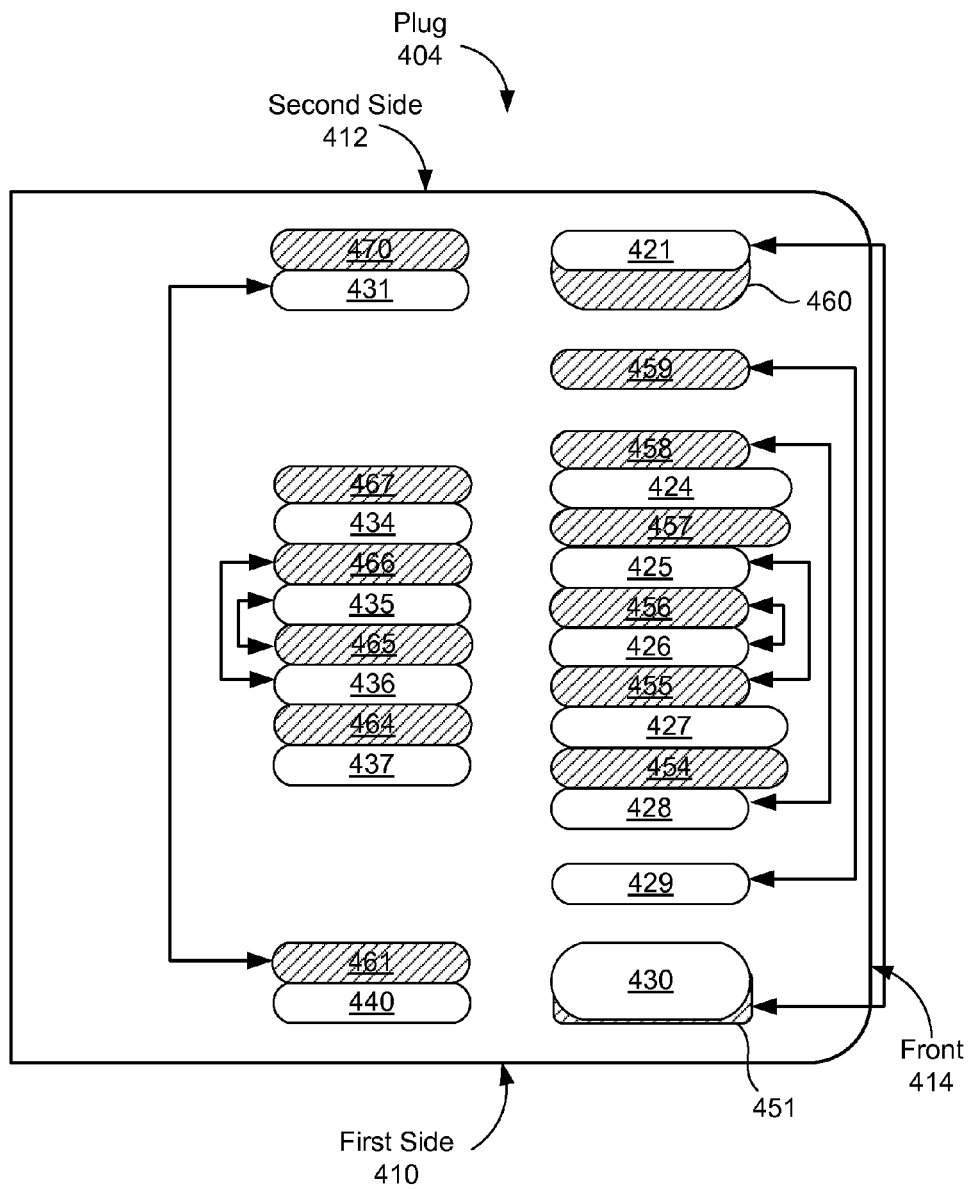
FIG. 4C is a top composite view of the plug shown in FIGS. 4A and 4B showing coupling between contacts according to an example embodiment.

FIG. 4C is a top composite view of the plug 404 shown in FIGS. 4A and 4B showing coupling between contacts according to an example embodiment. In this example, the contacts 422, 423, 432, 433, 438, 439, 452, 463, 458, 462, 463, 468, 469 shown in FIGS. 4A and 4B may be unused or non-existent. The contacts 451, 454 through 461, 464 through 467, 470 on the bottom 408 are shown with hatching, and the contacts 421, 424 through 431, 434 through 437, 440 on the top 406 are shown without shading. In this example, in the first top row and the first bottom row, the top contact 421 may be coupled to the bottom contact 451, the top contact 429 may be coupled to the bottom contact 459, the top contact 428 may be coupled to the bottom contact 458, the top contact 425 may be coupled to the bottom contact 455, and the top contact 426 may be coupled to the bottom contact 456. In the second top row and the second bottom row, the top contact 431 may be coupled to the bottom contact 461, the top contact 436 may be coupled to the bottom contact 466, and the top contact 435 may be coupled to the bottom contact 465.

Figure 4D:
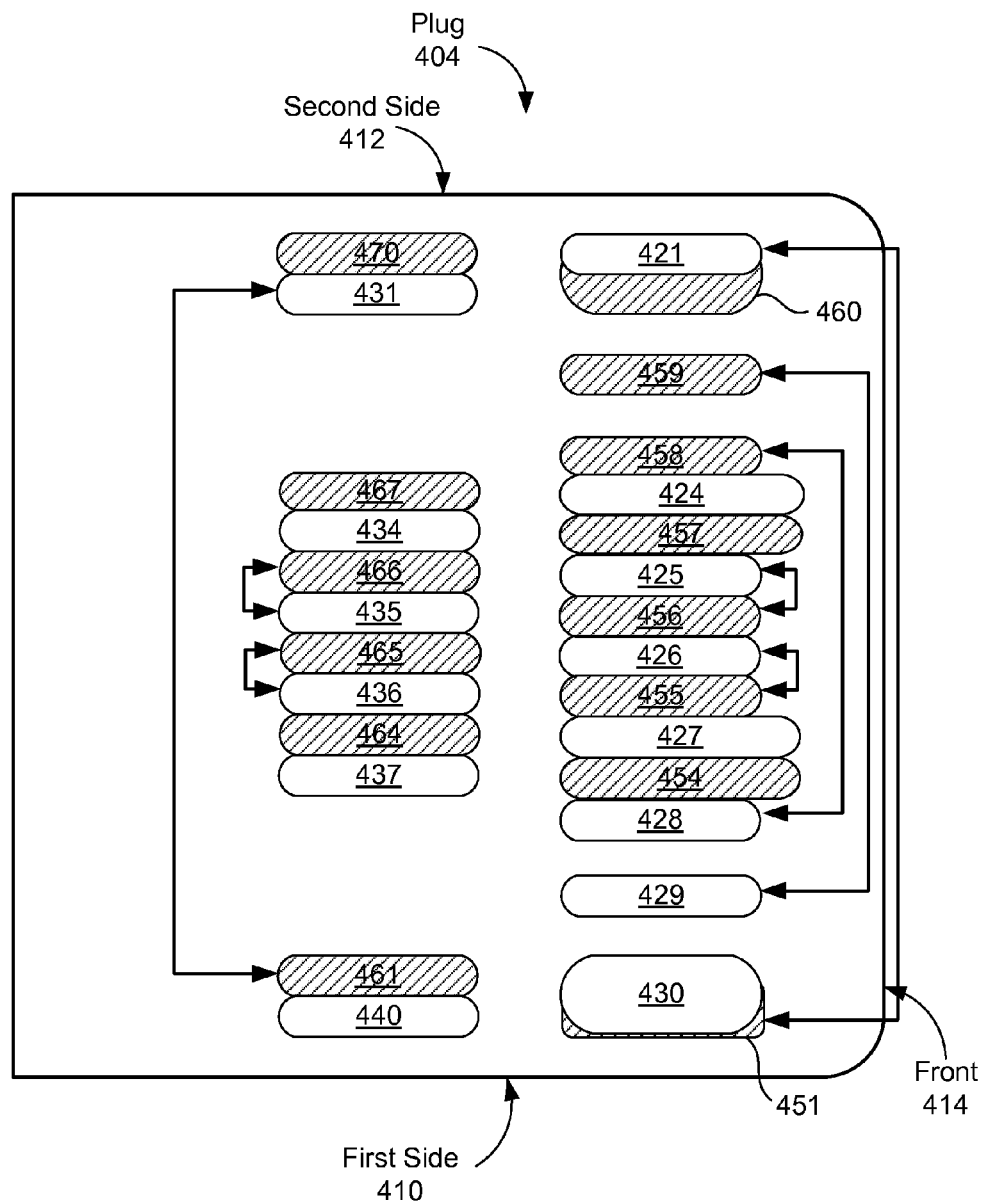
FIG. 4D is a top composite view of the plug shown in FIGS. 4A and 4B according to another example embodiment.

FIG. 4D is a top composite view of the plug shown in FIGS. 4A and 4B showing coupling between contacts according to another example embodiment. In this example, the contacts 422, 423, 432, 433, 438, 439, 452, 463, 458, 462, 463, 468, 469 shown in FIGS. 4A and 4B may be unused or nonexistent. As in FIG. 4C, the contacts 451, 454, 455 through 461, 464 through 467, 470 on the bottom 408 are shown with hatching, and the contacts 421, 424 through 431, 434 through 437, 440 on the top 406 are shown without shading. In this example, as in the example shown in FIG. 4C, in the first top row and the first bottom row, the top contact 421 may be coupled to the bottom contact 451, the top contact 429 may be coupled to the bottom contact 459, and the top contact 428 may be coupled to the bottom contact 458. However, in this example, the top contact 425 may be coupled to the bottom contact 456, the top contact 426 may be coupled to the bottom contact 455. In the second top row and second bottom row, the top contact 431 may be coupled to the bottom contact 461, as in the example shown in FIG. 4C. However, in this example, the top contact 435 may be coupled to the bottom contact 466, and the top contact 436 may be coupled to the bottom contact 465. While the couplings at 425, 456, 426, 455, 466, 435, 465, 436 do not provide true one hundred and eighty degree mirroring, the changes are within differential signaling pairs. The changing within differential signaling pairs reverses the polarity of the differential signaling pairs, which still maintains the differential signals. The coupling shown in FIG. 4D shortens the wires between the differential signaling pairs, reducing latency and/or delay.

Figure 5A:
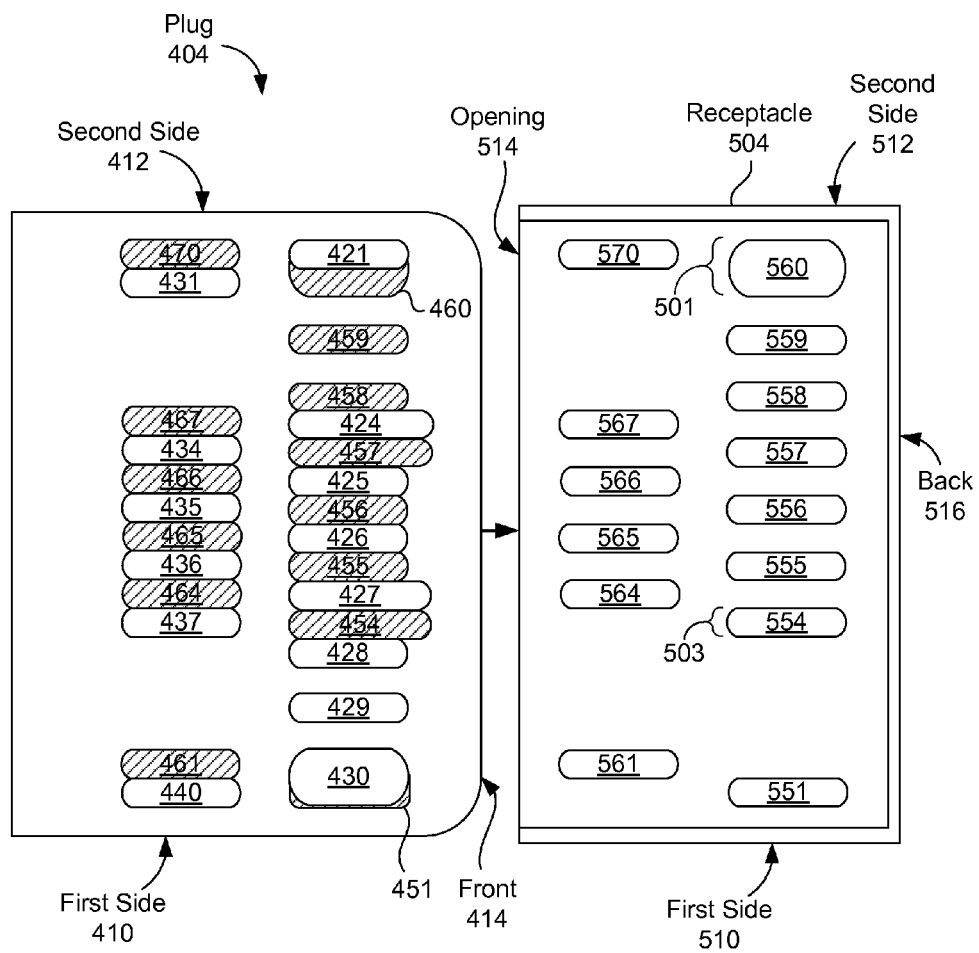
FIG. 5A shows a top composite view of the plug shown in FIGS. 4A and 4B and a cross-sectional view of a receptacle for receiving the plug according to an example embodiment.

FIG. 5A shows a top composite view of the plug 404 shown in FIGS. 4A and 4B and a cross-sectional view of a receptacle 504 for receiving the plug 404 according to an example embodiment. The receptacle 504 may have similar features to the receptacles 150, 304 described above, and/or either or both of the receptacles 150, 304 may have some or all of the features of the receptacle 504 described herein.

A side of the receptacle 504, such as a top or bottom of the receptacle 504, includes contacts 551, 554, 555, 556, 557, 558, 559, 560, 561, 564, 565, 566, 567, 570 corresponding to the contacts on either the top 406 or bottom 408 of the plug 404. When the plug 404 is inserted into the receptacle 504, within a second row of receptacle contacts which may be a second distance from the opening 514, the receptacle contact 561, which may be a second USB communication channel (CC) contact, will contact either the bottom contact 461 or the top contact 431, the receptacle contact 564, which may be a ground contact, will contact either the bottom contact 464 or the top contact 434, the receptacle contact 565, which may be a fifth receptacle contact included in a third differential signaling pair that carries signals according to the first communication protocol, will contact either the bottom contact 465 or the top contact 435, the receptacle contact 566, which may be a sixth receptacle contact included in the third differential signaling pair that carries signals according to the first communication protocol, will contact either the bottom contact 466 or the top contact 436, the receptacle contact 567, which may be a ground receptacle contact, will contact either the bottom contact 467 or the top contact 437, and the receptacle contact 570, will contact either the bottom contact 470 or the top contact 440, depending on the orientation of the plug 404.

Within a first row of receptacle contacts, which may be a first distance from the opening 514 that is longer than the second distance from the opening 514, a first receptacle contact 451, which may be a first USB CC contact, will contact either a bottom contact 451 or a top contact 421, a receptacle contact 554, which may be a ground contact, will contact either a bottom contact 454 or a top contact 424, a receptacle contact 555, which may be a first receptacle contact and be included in a first receptacle differential signaling pair that carries signals according to the first communication protocol, will contact either a bottom contact 455 or a top contact 425, a receptacle contact 556, which may be a second receptacle contact included in the first receptacle differential signaling pair that carries signals according to the first communication protocol, will contact either a bottom contact 456 or a top contact 426, a receptacle contact 557, which may be a ground contact, will contact either a bottom contact 457 or a top contact 427, a receptacle contact 558, which may be a third receptacle contact included in a second receptacle differential signaling pair that carries signals according to the second communication protocol, will contact either a bottom contact 458 or a top contact 428, a receptacle contact 559, which may be a fourth receptacle contact included in the second receptacle differential signaling pair that carries signals according to the second communication protocol, will contact either a bottom contact 459 or a top contact 429, and a receptacle contact 560, which may be a receptacle VBUS or power contact and have a width 501 that is wider than, such as twice as wide or at least twice as wide as, a width 503 the remaining receptacle contacts in the first row, will contact either a bottom contact 460 or a top contact 430 of the plug 404, depending on the orientation of the plug 404.

Figure 5B:
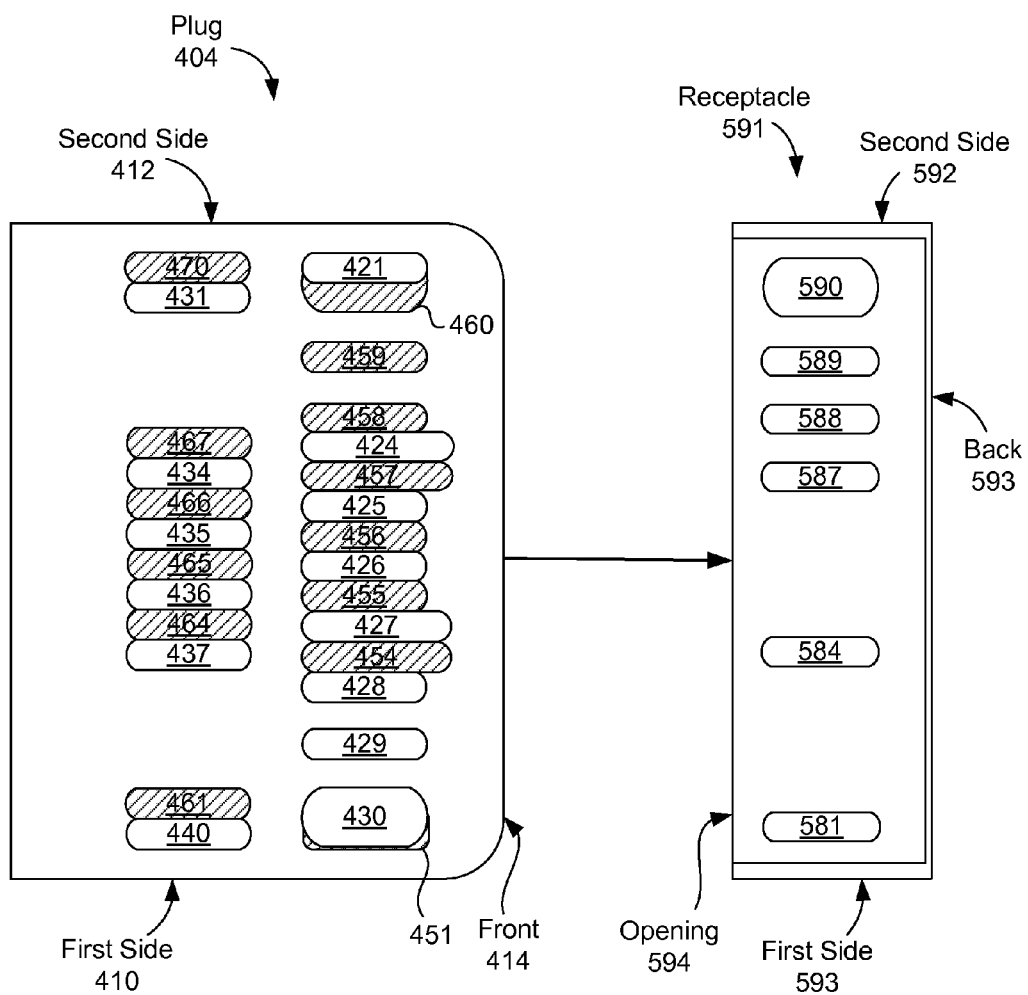
FIG. 5B shows the top composite view of the plug shown in FIGS. 4A and 4B and a cross-sectional view of a receptacle for receiving the plug according to another example embodiment.

FIG. 5B shows the top composite view of the plug 404 shown in FIGS. 4A and 4B and a cross-sectional view of a receptacle 591 for receiving the plug according to another example embodiment. In this example, the receptacle 591 includes only a single row of contacts 581, 584, 587, 588, 589, 590. The single row of contacts may include contacts which carry signals according to the second communication protocol with a lower data rate, such as USB 2.0, but do not carry signals according to the first communication protocol with the higher data rate, reducing power dissipation by the receptacle 591. The depth of the receptacle 591 may be less than a distance from the second row of contacts in the plug 404 to the front of the plug 414. The receptacle 591 may not include contacts corresponding to, or coupling with, the top contacts 425, 426 or bottom contacts 455, 456. In this example, when the plug 404 is inserted into the receptacle 591, a receptacle contact 581 may couple to either the bottom contact 451 or the top contact 421 of the plug 404, a receptacle contact 484 may couple to either the bottom contact 454 or the top contact 424 of the plug 404, receptacle contact 587 may couple to either the bottom contact 457 or the top contact 427 of the plug 404, a receptacle contact 588 may couple to either the bottom contact 458 or the top contact 428, a receptacle contact 589 may couple to either the bottom contact 459 or the top contact 429, and the receptacle contact 590 may couple to either the bottom contact 460 or the top contact 430, depending on the orientation of the plug 404.

The receptacle 591 may not include contacts corresponding to the receptacle contacts 556, 557 which were higher speed signaling pairs, according to an example embodiment. The lack of coupling to higher speed signaling pairs may allow the reduced receptacle 591 to operate at lower power than the receptacle 504. The reduced receptacle 591 may receive the plug 404 with either the top or bottom first row of contacts coupling with the single row of contacts in the receptacle 591, except that the central pair of higher speed differential signaling contacts 425, 426, 455, 456 in the plug 404 may not contact any contacts within the receptacle 591. The top or bottom second row of contacts within the plug 404 may not couple with any contacts within the reduced receptacle 591. In another example embodiment, the receptacle 591 may include contacts corresponding to the receptacle contacts 556, 557, but the contacts corresponding to the receptacle contacts 556, 557 may not be coupled to any wires or any node outside the receptacle 591, rendering the contacts corresponding to the receptacle contacts 556, 557 inoperative.

Figure 5C:
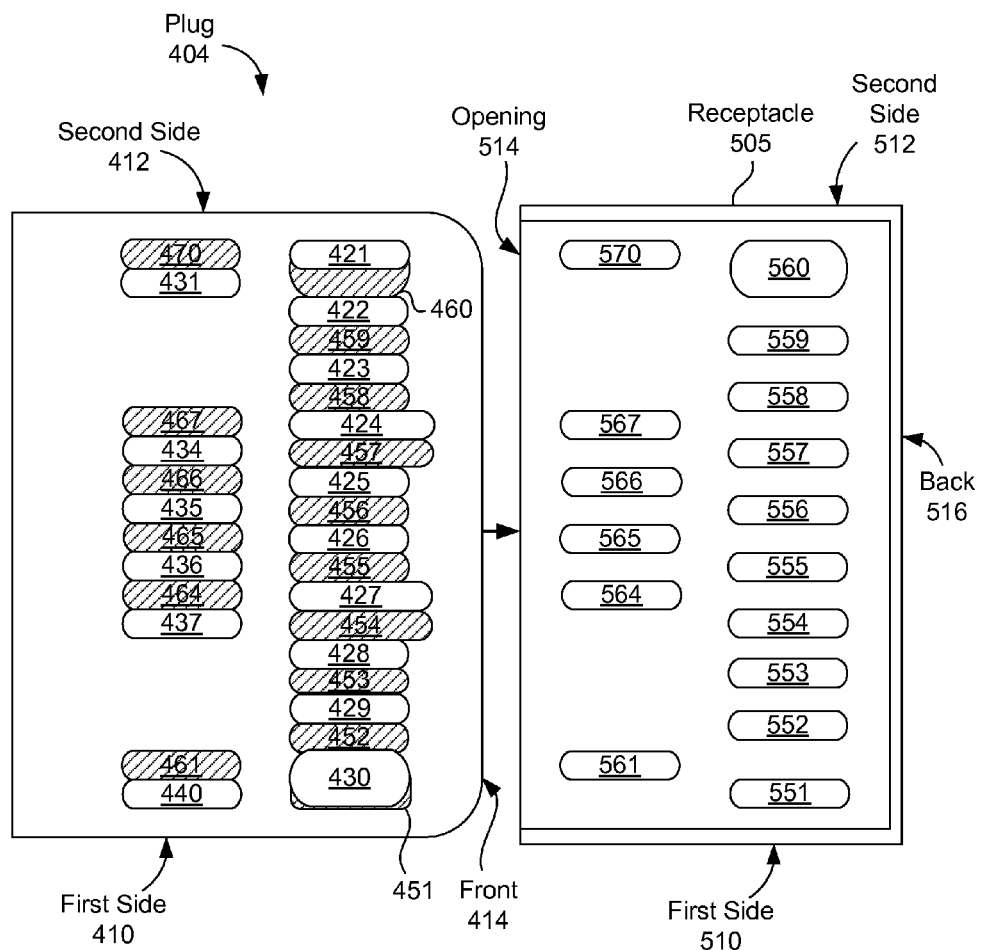
FIG. 5C shows a top composite view of the plug shown in FIGS. 4A and 4B and a cross-sectional view of a receptacle for receiving the plug according to another example embodiment.

FIG. 5C shows a top composite view of the plug 404 shown in FIGS. 4A and 4B and a cross-sectional view of a receptacle 505 for receiving the plug 404 according to another example embodiment. In this example, the plug 404 may include top differential auxiliary contacts 422, 423 on the first top row on the top of the plug 404, and may include bottom differential auxiliary contacts 452, 453 on the first bottom row on the bottom of the plug 404. The receptacle 505 may also include receptacle differential auxiliary contacts 552, 553 in the first receptacle row of contacts. The contacts shown in FIG. 5C may be used in a DisplayPort mode, such as when a control signal, described below, indicates that DisplayPort signals should be transmitted and/or received, according to an example embodiment.

Figure 5D:
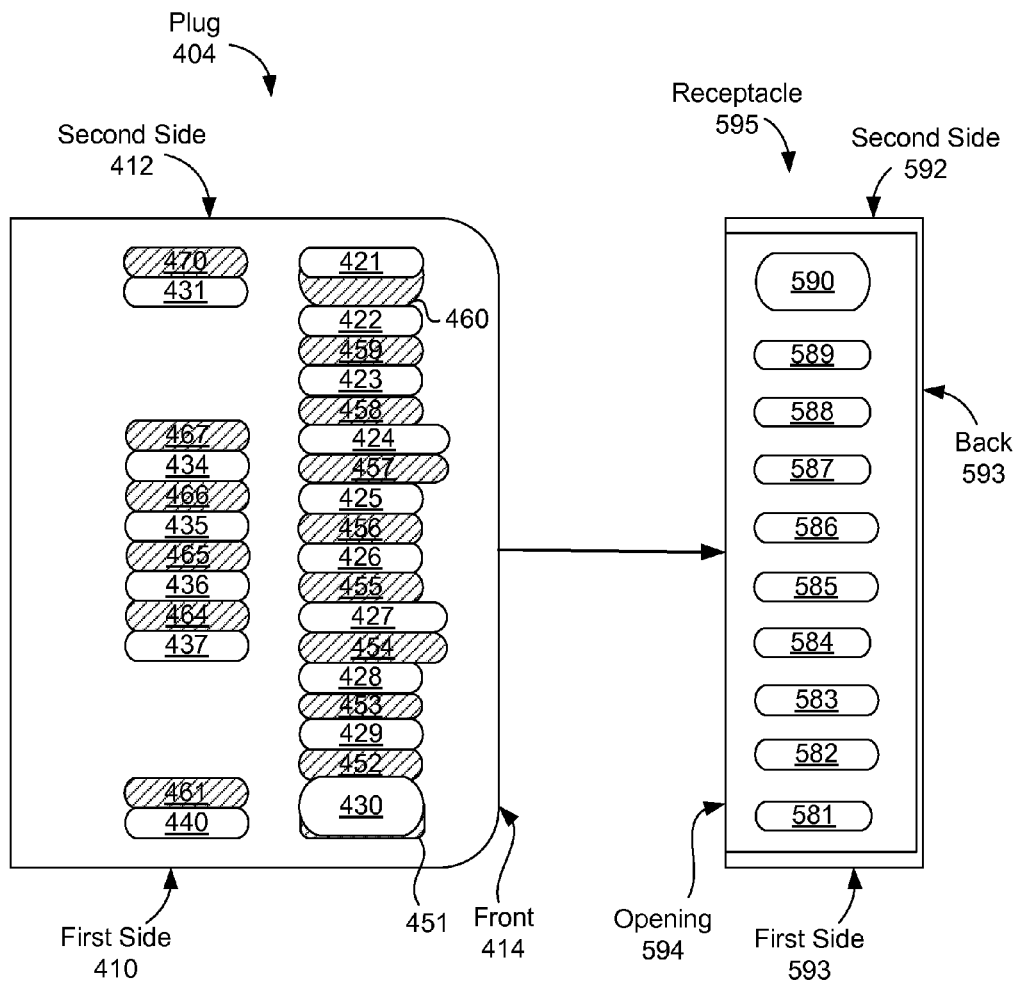
FIG. 5D shows the top composite view of the plug shown in FIG. 5C and a cross-sectional view of a receptacle for receiving the plug according to another example embodiment.

FIG. 5D shows the top composite view of the plug 404 shown in FIG. 5C and a cross-sectional view of a receptacle 595 for receiving the plug according to another example embodiment. In this example, as in the example shown and described with respect to 5B, the receptacle 595 may include only a single row of contacts. In this example, the single row of contacts may include receptacle differential auxiliary contacts 582, 583. The contacts shown in FIG. 5D may be used in the DisplayPort mode, such as when a control signal, described below, indicates that DisplayPort signals should be transmitted and/or received, according to an example embodiment.

Figure 6:
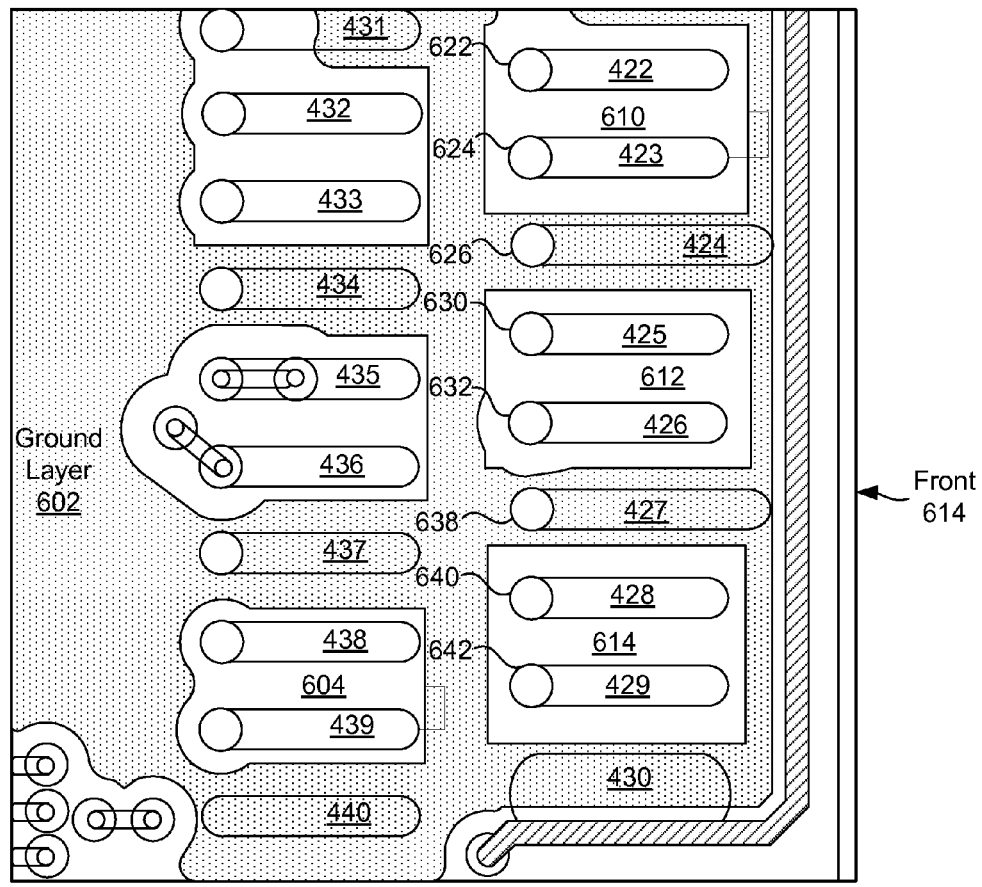
FIG. 6 shows a top cross-sectional view of a portion of the plug shown in FIGS. 4A, 4B, 4C, 4D, 5A, and 5B according to an example embodiment.

FIG. 6 shows a top cross-sectional view of a portion of the plug 404 shown in FIGS. 4A, 4B, 4C, 4D, 5A, and 5B according to an example embodiment. In this example, the top contacts 422, through 440 may include vias 622, 624, 626, 630, 632, 638 (not all of the vias are labeled in FIG. 6). The vias 622, 624, 626, 630, 632, 638 may couple the top contacts 422 through 440 to bottom contacts 451 through 470 (not shown in FIG. 6) and/or to the cord contacts 441 through 450 and 471 through 480 (not shown in FIG. 6). The vias 622, 624, 626, 630, 632, 638 may be located at rear portions of the respective contacts 42 through 440, distal to the front portion 414 and/or farther from the front portion 414 than remaining portions of the contacts 422 through 440. The bottom contacts 451 through 470 may also include vias located at rear portions of the respective bottom contacts 451 through 470. The location and/or placement of the vias 622, 624, 626, 630, 632, 638 within the rear portions of the contacts 422 through 440 may reduce the likelihood of damage to the via 622, 624, 626, 630, 632, 638 when the plug 404 is inserted into the receptacle, with front portions of the contacts 422 through 440 contacting receptacle contacts before the rear portions of the contacts 422 through 440 contact the receptacle contacts. The vias 622, 624, 626, 330, 632, 638 may also be located on middle or front portions of the contacts 422 through 440. The top contacts 422 through 440 may be included on a top portion and/or first or top layer of the plug 404, and/or the bottom contacts 451 through 470 may be located on a bottom portion and/or last or bottom layer of the plug 404.

The plug may include a second layer which may be considered a ground layer 602. The ground layer 602 may be immediately below the first or top layer (labeled as 761 in FIG. 7B). The ground layer 602 may include a conductive sheet, and may be made of a conductive material, such as metal including aluminum, copper, or steel, or a semiconductor substrate such as silicone doped with high levels of impurities.

The ground layer 602 may include recessed areas 610, 612, 614 (not all of the recessed areas are labeled in FIG. 6) below differential pairs on the plug 404. In the example shown in FIG. 6, the ground layer 602 includes a first recessed area below the first top differential signaling pair that includes top contacts 426, 426, a second recessed area below the third top differential signaling pair that includes top contacts 428, 429, and a third recessed area below a fourth top differential signaling pair that includes top contacts 422, 423.

The recessed areas 604, 606, 608 may be superposed by at least one contact 422, 423, 425, 426, 428, 429, 432, 433, 435, 436, 438, 439 in a direction perpendicular to the top portion, first or top layer, and/or ground layer 602 of the plug 404. For example, the differential pair including contacts 425, 426 may be above and/or superpose the recessed area 612 within the ground layer 602. The recessed area 612 may be superposed by both the contacts 425, 426 and may, when viewed from a two-dimensional perspective above the plug, completely surround the contacts 425, 426. Other recessed areas within the ground layer 602 may also be superposed by at least one contact and/or a differential pair.

In an example embodiment, the ground layer 602 may include recessed areas superposed by all of the top differential signaling pairs and/or all non-ground contacts in the top portion 406 and/or first or top layer of the plug 404. Another ground layer above the bottom portion 408 may also include recessed areas superposed by any or all of the bottom differential signaling pairs and/or all non-ground contacts in the bottom portion 408 and/or first or top layer of the plug 404

Figure 7A:
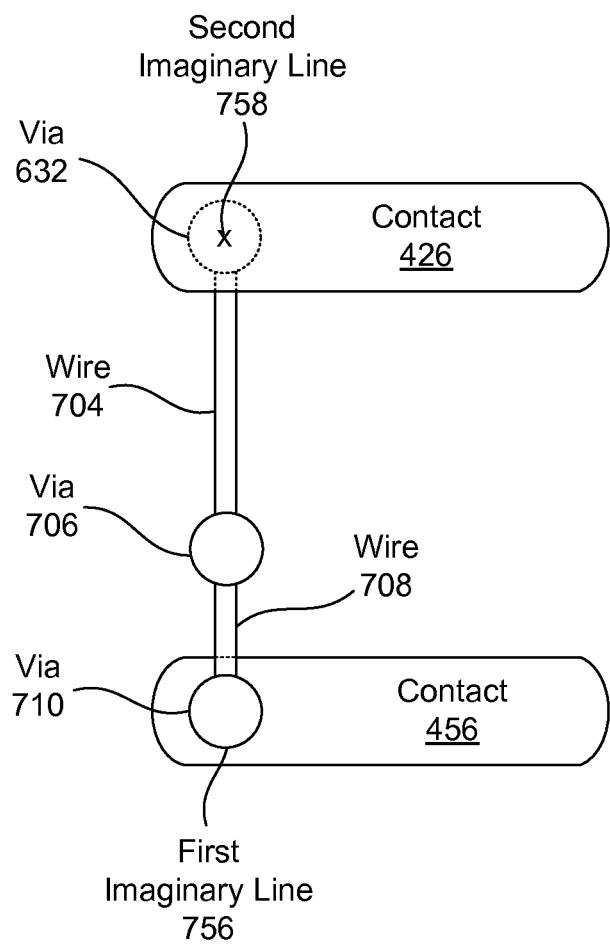
FIG. 7A shows a top composite view of components of the plug shown in FIGS. 4A, 4B, 4C, 4D, 5A, and 5B according to an example embodiment.

FIG. 7A shows a top composite view of components of the plug shown in FIGS. 4A, 4B, 4C, 4D, 5A, and 5B according to an example embodiment. In this example, top contact 426 may be coupled to bottom contact 456. The top contact 426 may include the via 632 on a rear portion of the contact 426, as shown and described with respect to FIG. 6, and the bottom contact 456 may include a via 710 on a rear portion of the contact 456.

The contacts 426, 456 may be coupled to each other by their respective vias 632, 710, and by an interior via 706 which is included on one or more middle layers of the plug 404 (not labeled in FIG. 7A). In an example in which the plug 404 includes six layers, the interior via 706 may be a three-four via, adjoining the third and fourth layers of the plug 404. In the example shown in FIG. 7A, a via 731 is coupled to the interior via 706 by wire 704 and the via 710 is coupled to the via 704 by wire 708.

Figure 7B:
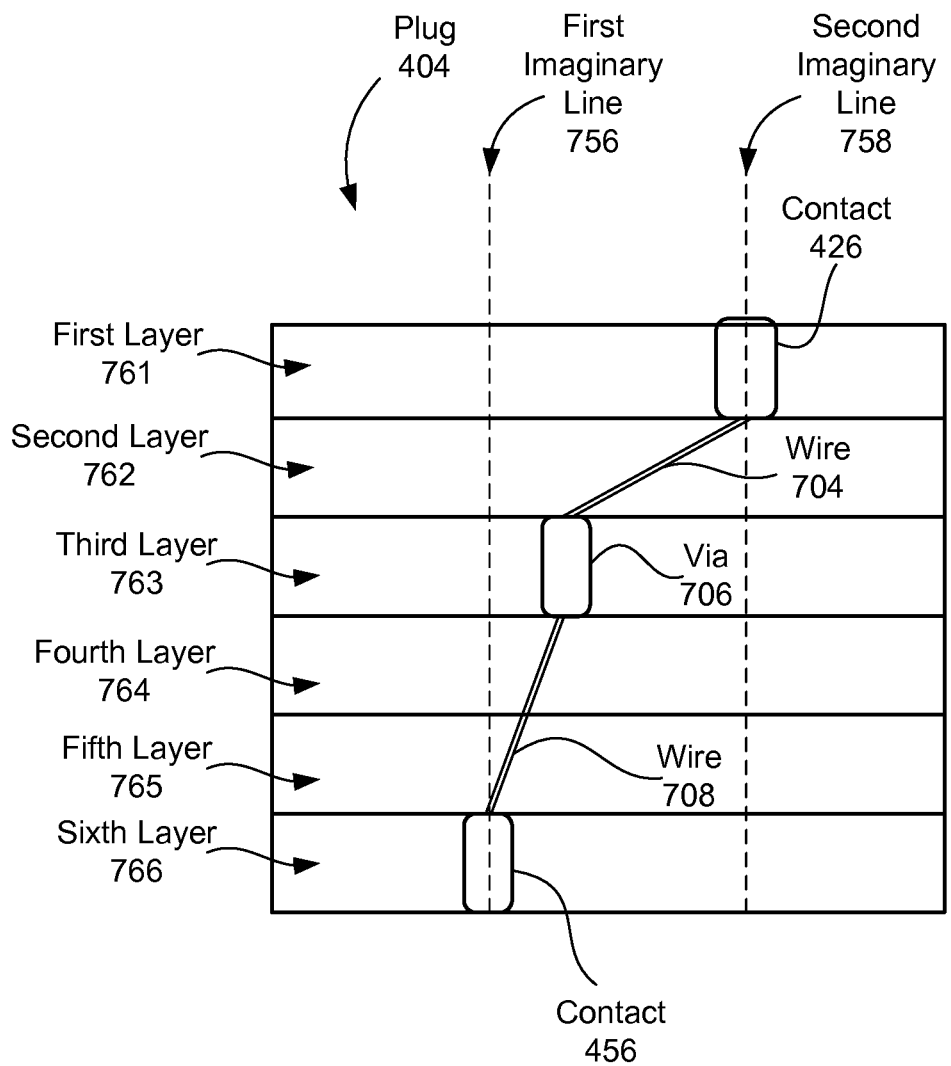
FIG. 7B shows a side composite view of components of the plug shown in FIGS. 4A, 4B, 4C, 4D, 5A, 5B, and 7A according to an example embodiment.

The layer on which the interior via 706 is included may be closer to the top layer that includes the top contact 426 than to the bottom layer that includes the bottom contact 456 (as shown in FIG. 7B). To achieve approximately equal lengths of the wires 704, 708, such as the length of the wire 708 being within five percent or within ten percent of the length of the wire 704, the via 706 may be closer to a first imaginary line 756, which may also be considered a line and/or axis, extending through the via 710 than to a second imaginary line 758, which may also be considered a line and/or axis, extending through the via 632. The first imaginary line 756 may extend from the via 710 toward the reader and/or top layer in a direction perpendicular to the bottom layer 766 (shown in FIG. 7B) and/or top layer 761 (shown in FIG. 7B). The second imaginary line 758 may extend from the via 632 away from the reader and/or toward the bottom layer in a direction perpendicular to the top layer 761 and/or bottom layer 766.

FIG. 7B shows a side composite view of components of the plug 404 shown in FIGS. 4A, 4B, 4C, 4D, 5A, 5B, and 7A according to an example embodiment. In this example, the plug 754 includes six layers, including a first layer 761 (also referred to as a top layer), a second layer 762, a third layer 763, a fourth layer 764, a fifth layer 765, and a sixth layer 766 (also referred to as a bottom layer). While the example plug 404 shown in FIG. 7B includes six layers, the plug 404 may include other numbers of layers, and may include a plurality of middle layers and/or layers other than the top layer and bottom layer.

The contacts 726, 756, which may include the vias 632, 710 shown in FIG. 7A, are coupled to each other by the interior via 706. The interior via 706 may be closer to the first imaginary line 756 than to the second imaginary line 758. The first imaginary line 756 may extend from the contact 456 (and/or the via 710) to the top layer and/or first layer 761 in a direction perpendicular to the top layer and/or first layer 761 and bottom layer and/or sixth layer 766. The second imaginary line 758 may extend from the contact 426 (and/or the via 632) to the bottom layer and/or sixth layer 766 in a direction perpendicular to the top layer and/or first layer 761 and the bottom layer and/or sixth layer 766 of the plug 404. The wires 704, 708, which couple the contacts 426, 456 and/or vias 632, 710 to the interior via 706, may be of approximately equal length, improving latency and/or delay of communication between the contacts 426, 456.

In an example embodiment, the plug 404 may include a second interior via coupling the second top contact 425 (not shown in FIG. 7B) to the second bottom contact 455 (not shown in FIG. 7B), and other contacts may be coupled to each other in similar manners to equalize distances between wires. The second intermediary via may be closer to a third imaginary line than to a fourth imaginary line. The third imaginary line may extend from the second bottom contact to the top layer in the direction perpendicular to the top layer and the bottom layer. The fourth imaginary line may extend from the second top contact to the bottom layer in the direction perpendicular to the top layer and the bottom layer. The second via may approximately equidistant from the second top contact and the second bottom contact.

Figure 8:
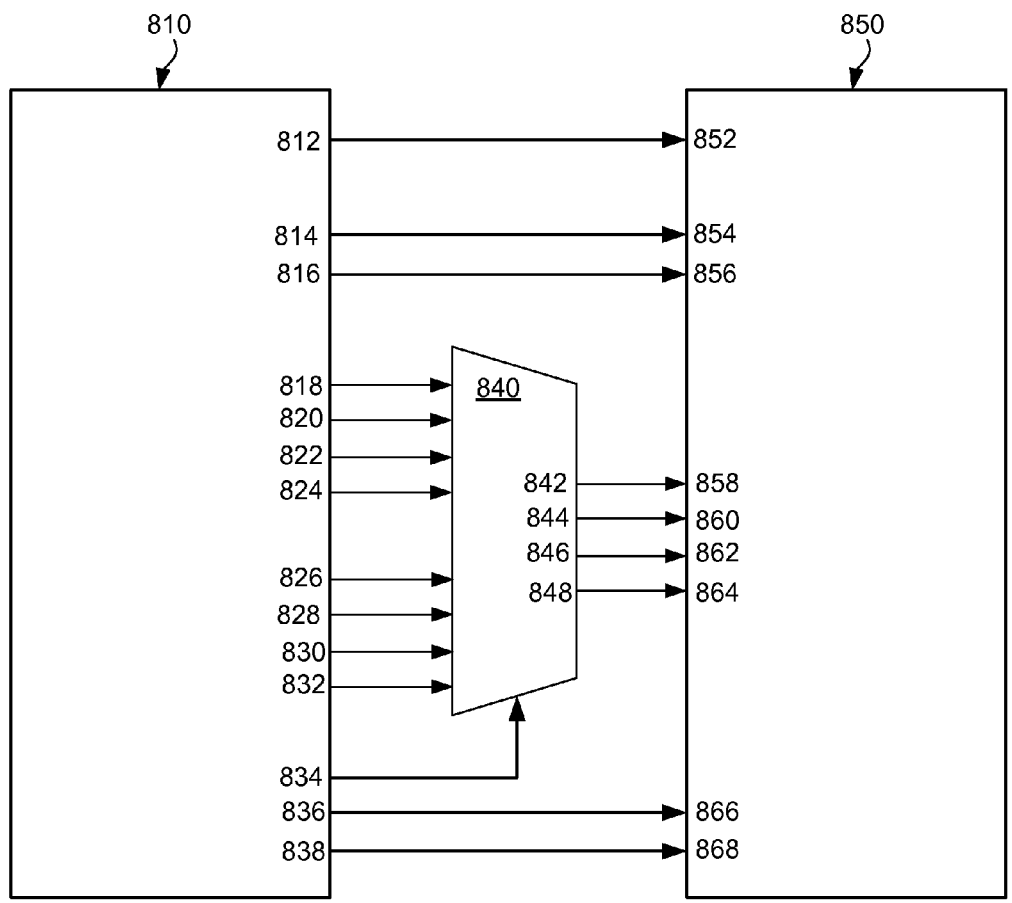
FIG. 8 shows components of a system in which the electrical connector can provide signals according to alternative communication protocols according to an example embodiment.

FIG. 8 shows components of a system in which the electrical connector can provide signals according to alternative communication protocols according to an example embodiment. In the example shown in FIG. 8, a cord 810 may include features of either or both of the cords 102, 202 described above, and/or the cords 102, 202 may include features of the cord 810 described herein. A plug 850 may include features of any of the plugs 104, 204, 404 described above, and/or any of the plugs 104, 204, 404 may include features of the plug 850 described herein. A selection circuit 840, which may include a multiplexer, may be included in the plug 850, or may be included in an electrical connector that includes the cord 810 and plug 850 and be interposed between and coupled to both the cord 810 and plug 850.

The cord 810 may include wires represented by the arrows pointing from the cord 810 to either the plug 850 or the selection circuit 840. The cord 810 may include a power node 812 coupled to a power node 852 of the plug 850. The power node 852 may correspond to either any or all of the power nodes 430, 440, 460, 470. The cord 810 may include a second differential signaling pair of contacts including contacts 814, 816 coupled to contacts 854, 856 of the plug 850. The contacts 854, 856 may correspond to any or all of the third and fourth contacts 236, 238, 270, 272, 428, 429, 458, 459, and may carry signals according to the second communication protocol, such as USB 2.0, which has a lower data rate from the first communication protocol. The cord 810 may also include communication channel (CC) nodes 836, 838 coupled to communication channel (CC) nodes 866, 868 on the plug 850. The CC nodes 866, 868 may correspond to contacts 421, 431, 451, 461.

The system 810 may also include two sets of differential signaling nodes for carrying signals according to the first communication protocol, such as USB 3.0 or 3.1, and/or a third communication protocol, such as DisplayPort. The first set of differential signaling nodes may include a pair of differential transmission nodes 818, 820 and a pair of differential reception nodes 822, 824. The differential transmission and reception nodes 818, 820, 822, 824 may be for communication according to the first communication protocol, such as USB 3.0 or 3.1, and may be coupled to the selection circuit 840.

The second set of differential signaling nodes may include a pair of differential transmission nodes 826, 828 and a pair of differential reception nodes 830, 832. The differential reception and transmission nodes 826, 828, 830, 832 may communicate according to a third communication protocol, such as DisplayPort, which may have a faster data rate than the second communication protocol, and may have a faster, slower, or equal data rate to the first communication protocol.

The selection circuit 840 may be configured to select either the first set of differential signaling nodes 818, 820, 822, 824 or the second set of differential signaling nodes 826, 828, 830, 832. The selection circuit 840 may be configured to select either the first set of differential signaling nodes 818, 820, 822, 824 or the second set of differential signaling nodes 826, 828, 830, 832 based on a control signal. The cord 810 may include a control node 834 which carries a control signal from an electronic device to which the cord is coupled. The selection circuit 840 may transmit signals from either the first set of differential signaling nodes 818, 820, 822, 824 or the second set of differential signaling nodes 826, 828, 830, 832 to the plug 850 based on the control signal received from the control node 834.

The plug 850 may include two differential signaling pairs 858, 860, 862, 864. The differential signaling pairs 858, 860, 862, 864 may correspond to contacts 224, 226, 230, 232, 258, 260, 264, 266, 425, 426, 435, 436, 455, 456, 465, 466. The differential signaling pairs 858, 860, 862, 864 may carry, transmit, and/or receive, differential signals according to either the first communication protocol or the second communication protocol, depending on the control signal received by the selection circuit 840.

Figure 9:
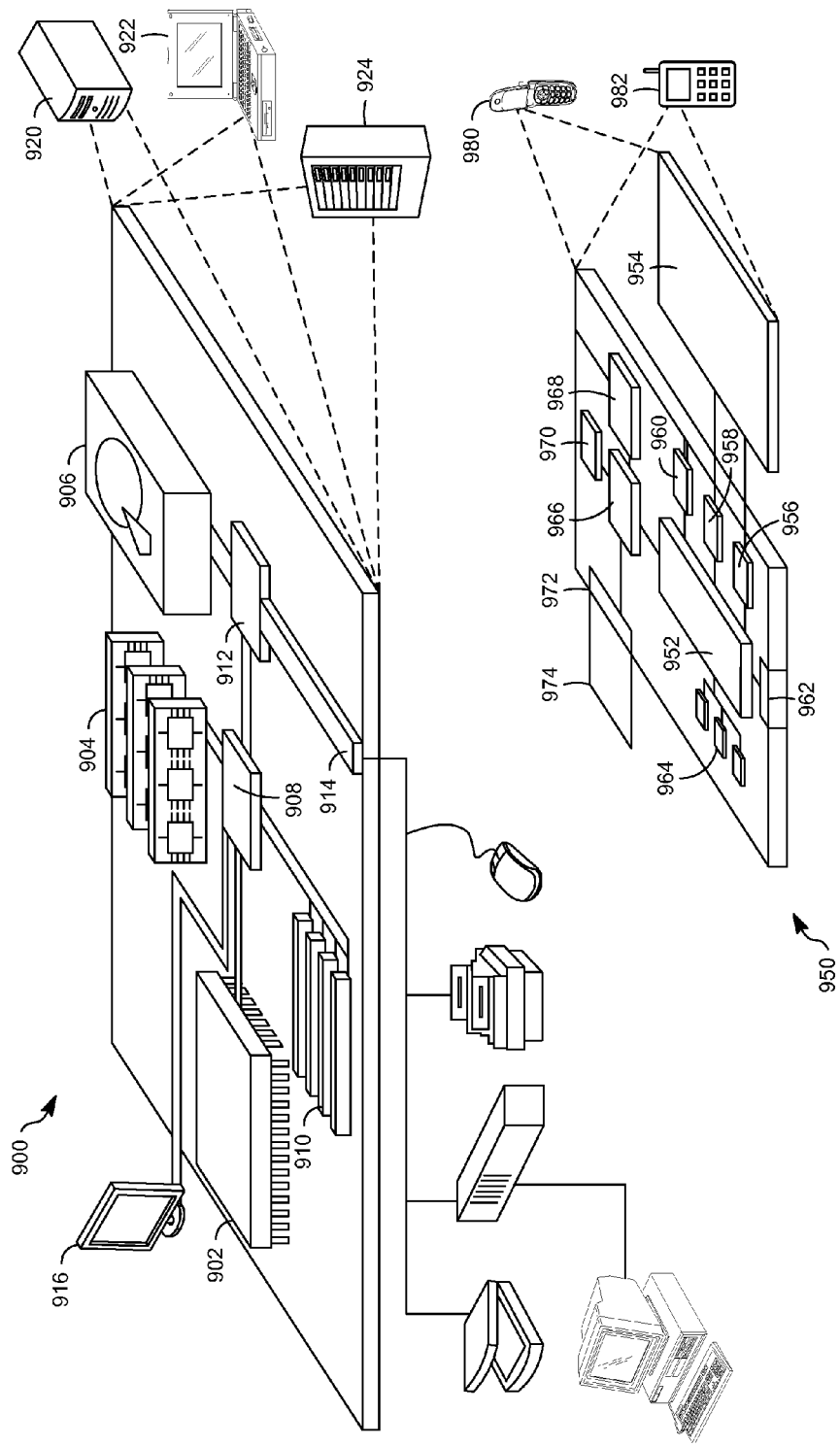
FIG. 9 shows an example of a generic computer device and a generic mobile computer device, which may be used with the techniques described here.

FIG. 9 shows an example of a generic computer device 900 and a generic mobile computer device 950, which may be used with the techniques described here. Either or both of the generic computer device 900 and/or generic mobile computer device 950 may include either of the receptacles 150, 304, may be a version of the computing device 300, and/or may couple to any of the cords 102, 202, 810 described above. Computing device 900 is intended to represent various forms of digital computers, such as laptops, desktops, workstations, personal digital assistants, servers, blade servers, mainframes, and other appropriate computers. Computing device 950 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high speed controller 908 manages bandwidth-intensive operations for the computing device 900, while the low speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 974 may also be provided and connected to device 950 through expansion interface 972, which may include, for example, a SIMM (Single In Line Memory Module) card interface. Such expansion memory 974 may provide extra storage space for device 950, or may also store applications or other information for device 950. Specifically, expansion memory 974 may include instructions to carry out or supplement the processes described above, and may include secure information also. Thus, for example, expansion memory 974 may be provide as a security module for device 950, and may be programmed with instructions that permit secure use of device 950. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 974, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 970 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An electrical connector comprising:
   a cord comprising a plurality of wires; and
   a plug extending from the cord, the plug including:
      a first top row of contacts included in a top portion of the plug, the first top row of contacts being coupled to the plurality of wires and including:
         a first top differential signaling pair configured to carry signals according to a first communication protocol, and
         a second top differential signaling pair configured to carry signals according to a second communication protocol,
         the first top differential signaling pair being closer to a center of the first top row of contacts than the second top differential pair and the first communication protocol having a higher data rate than the second communication protocol; and
      a first bottom row of contacts included in a bottom portion of the plug, the first bottom row of contacts being coupled to the first top row of contacts and arranged to maintain a same arrangement of contacts and electrical paths as the first top row of contacts to the plurality of wires when the plug is rotated one hundred and eighty degrees.

2. The electrical connector of claim 1, wherein the plug further includes:
   a second top row of contacts included in the top portion of the plug, the second top row of contacts being coupled to the plurality of wires and including a third top differential signaling pair configured to carry signals according to the first communication protocol, the third top differential signaling pair being closer to a center of the second top row of contacts than remaining contacts in the second top row; and
   a second bottom row of contacts included in the bottom portion of the plug, the second bottom row of contacts being coupled to the second top row of contacts and arranged to maintain the same arrangement of contacts and electrical paths to the plurality of wires when the plug is rotated one hundred and eighty degrees.

3. The electrical connector of claim 1, wherein:
   the plug comprises a printed circuit board (PCB), the PCB comprising at least a top layer including the top portion of the plug, a bottom layer comprising the bottom portion of the plug, a plurality of middle layers between the top layer and the bottom layer, a first side adjacent to the top layer and the bottom layer, and a second side opposing the first side and adjacent to the top layer and the bottom layer;
   the first top differential signaling pair comprises a first top contact and a second top contact;
   the bottom portion comprises a first bottom differential signaling pair comprising a first bottom contact and a second bottom contact, the first bottom contact being coupled to the first top contact by a via and the second bottom contact being coupled to the second top contact; and
   the plurality of middle layers, the plurality of middle layers including a middle layer that is closer to the top layer than to the bottom layer, the middle layer including the via coupling the first top contact to the first bottom contact, the via being closer to a first axis than to a second axis, the first axis extending from the first bottom contact to the top layer in a direction perpendicular to the top layer and the bottom layer, the second axis extending from the first top contact to the bottom layer in the direction perpendicular to the top layer and the bottom layer.

4. The electrical connector of claim 3, wherein the first via is approximately equidistant from the first top contact and the first bottom contact.

5. The electrical connector of claim 3, wherein:
the via includes a first via; and
the middle layer includes a second via coupling the second top contact to the second bottom contact, the second via being closer to a third axis than to a fourth axis, the third axis extending from the second bottom contact to the top layer in the direction perpendicular to the top layer and the bottom layer, the fourth axis extending from the second top contact to the bottom layer in the direction perpendicular to the top layer and the bottom layer, the second via being approximately equidistant from the second top contact and the second bottom contact.

6. The electrical connector of claim 1, wherein the first top row of contacts further comprises a ground contact between the first top differential signaling pair and the second top differential signaling pair.

7. The electrical connector of claim 1, wherein the first top row of contacts includes at least one top ground contact, a front portion of the at least one top ground contact being closer to a front portion of the plug than any portion of any of the other contacts in the first top row of contacts.

8. The electrical connector of claim 1, wherein the first top row of contacts includes at least one top ground contact, the at least one top ground contact being longer than any of the other contacts in the first top row of contacts.

9. The electrical connector of claim 1, wherein the first top row of contacts includes a top power contact, the top power contact being wider than any of the other contacts in the first top row of contacts.

10. The electrical connector of claim 1, wherein:
the first top differential signaling pair is configured to transmit and/or receive data according to a Universal Serial Bus (USB) 3.0 or USB 3.1 protocol; and
the second top differential signaling pair is configured to transmit and/or receive data according to a USB 2.0 protocol.

11. The electrical connector of claim 1, further comprising a selection circuit configured to switch the first communication protocol between a first high speed communication protocol and a second high speed communication protocol.

12. The electrical connector of claim 1, further comprising a selection circuit configured to switch the first communication protocol between Universal Serial Bus (USB) 3.0 or USB 3.1 and DisplayPort.

13. An electrical connector comprising:
a cord comprising a plurality of wires; and
a plug extending from the cord, the plug including:
a top portion, a first side portion adjacent to the top portion, a bottom portion adjacent to the first side portion and opposing the top portion, and a second side portion adjacent to the top portion and to the bottom portion, the second side portion opposing the first side portion;
the top portion including at least:
a first top row of contacts, the first top row of contacts including:
a first top contact that is closer to a center of the first top row of contacts than remaining contacts in the first top row of contacts; and
at least one top ground contact, a front portion of the at least one top ground contact being closer to a front portion of the plug than any portion of any of the other contacts in the first top row of contacts; and a second top row of contacts including a second top contact that is closer to a center of the second top row of contacts than remaining contacts in the second top row of contacts; and
the bottom portion including at least:
a first bottom row of contacts, the first bottom row of contacts including a first bottom contact that is closer to a center of the first bottom row of contacts than remaining contacts in the first bottom row of contacts, the first bottom contact being coupled to the first top contact; and
a second bottom row of contacts including a second bottom contact that is closer to a center of the second bottom row of contacts than remaining contacts in the second bottom row of contacts, the second bottom contact being coupled to the second top contact.

14. The electrical connector of claim 13, wherein:
the first top contact is included in a first top differential signaling pair comprising the first top contact and a third top contact, the third top contact being closer to the center of the first top row than contacts in the first top row other than the first top contact;
the first bottom contact is included in a first bottom differential signaling pair comprising the first bottom contact and a third bottom contact, the third bottom contact being coupled to the third top contact and closer to the center of the first bottom row than contacts in the first bottom row other than the first bottom contact;
the first top contact and the first bottom contact are a same distance from the first side portion; and
the third top contact and the third bottom contact are a same distance from the second side portion.

15. The electrical connector of claim 13, wherein:
the first top contact is included in a first top differential signaling pair comprising the first top contact and a third top contact, the third top contact being closer to the center of the first top row than contacts in the first top row other than the first top contact;
the first bottom contact is included in a first bottom differential signaling pair comprising the first bottom contact and a third bottom contact, the third bottom contact being coupled to the third top contact and closer to the center of the first bottom row than contacts in the first bottom row other than the first bottom contact;
the first top contact and the third bottom contact are a same distance from the first side portion; and
the third top contact and the first bottom contact are a same distance from the second side portion.

16. The electrical connector of claim 13, wherein:
the first top row of contacts is a first distance from a front of the plug; and
the second top row of contacts is a second distance from the front of the plug, the second distance being greater than the first distance.

17. The electrical connector of claim 13, wherein the first top row of contacts includes a top power contact, the top power contact being wider than any of the other contacts in the first top row of contacts.

18. The electrical connector of claim 13, wherein:
the first top row of contacts includes a third top contact that is closer to the second side portion than either the first top contact or the second top contact.

19. The electrical connector of claim 18, wherein the first and second top contacts are configured to transmit and/or receive signals according to a first communication protocol and the third top contact is configured to transmit and/or receive signals according to a second communication protocol, the first communication protocol having a higher data rate than the second communication protocol.

20. The electrical connector of claim 13, wherein:
the plug comprises a printed circuit board (PCB);
the first top row of contacts and the second top row of contacts are included on a top layer of the PCB; and
the first bottom row of contacts and the second bottom row of contacts are included on a bottom layer of the PCB.

21. The electrical connector of claim 13, wherein the electrical connector comprises a Universal Serial Bus (USB) connector.

22. The electrical connector of claim 13, further comprising:
a multiplexer coupled to the wires comprised by the cord and to the first top contact, the second top contact, the first bottom contact, and the second bottom contact, the multiplexer being configured to switch the electrical connector between a DisplayPort mode and a Universal Serial Bus (USB) mode.

23. An electrical connector comprising:
a cord comprising a plurality of wires; and
a plug extending from the cord, the plug comprising electrical contacts on a top portion and a bottom portion of the plug so that when the plug is rotated one hundred and eighty degrees an arrangement and coupling of the electrical contacts remains the same, the electrical contacts comprising:
a top row of electrical contacts on the top portion of the plug, the top row of electrical contacts comprising a first top differential pair configured to transmit signals according to a first communication protocol and a second top differential pair configured to transmit signals according to a second communication protocol, the first top differential pair being closer to a center of the top row of electrical contacts than the second top differential pair, the first communication protocol having a higher data rate than the second communication protocol.

24. The electrical connector of claim 23, wherein:
the first communication protocol includes a Universal Serial Bus (USB) 3.0 or USB 3.1 communication protocol; and
the second communication protocol includes a USB 2.0 communication protocol.

25. An electrical connector comprising:
a cord comprising a plurality of wires; and
a plug extending from the cord, the plug including:
a top portion, a first side portion adjacent to the top portion, a bottom portion adjacent to the first side portion and opposing the top portion, and a second side portion adjacent to the top portion and to the bottom portion, the second side portion opposing the first side portion;
the top portion including at least:
a first top row of contacts, the first top row of contacts including:
a first top contact that is closer to a center of the first top row of contacts than remaining contacts in the first top row of contacts; and
at least one top ground contact, the at least one top ground contact being longer than any of the other contacts in the first top row of contacts; and
a second top row of contacts including a second top contact that is closer to a center of the second top row of contacts than remaining contacts in the second top row of contacts; and
the bottom portion including at least:
a first bottom row of contacts, the first bottom row of contacts including a first bottom contact that is closer to a center of the first bottom row of contacts than remaining contacts in the first bottom row of contacts, the first bottom contact being coupled to the first top contact; and
a second bottom row of contacts including a second bottom contact that is closer to a center of the second bottom row of contacts than remaining contacts in the second bottom row of contacts, the second bottom contact being coupled to the second top contact.

26. The electrical connector of claim 25, wherein:
the first top contact is included in a first top differential signaling pair comprising the first top contact and a third top contact, the third top contact being closer to the center of the first top row than remaining contacts in the first top row other than the first top contact;
the first bottom contact is included in a first bottom differential signaling pair comprising the first bottom contact and a third bottom contact, the third bottom contact being coupled to the third top contact and closer to the center of the first bottom row than remaining contacts in the first bottom row other than the first bottom contact;
the first top contact and the first bottom contact are a same distance from the first side portion; and
the third top contact and the third bottom contact are a same distance from the second side portion.

27. The electrical connector of claim 25, wherein:
the first top row of contacts includes a third top contact that is closer to the second side portion than either the first top contact or the second top contact.

28. The electrical connector of claim 27, wherein the first and second top contacts are configured to transmit and/or receive signals according to a first communication protocol and the third top contact is configured to transmit and/or receive signals according to a second communication protocol, the first communication protocol having a higher data rate than the second communication protocol.

* * * * *